United States Patent [19]

Mahmood et al.

[11] Patent Number: 5,519,627
[45] Date of Patent: May 21, 1996

[54] DATAPATH SYNTHESIS METHOD AND APPARATUS UTILIZING A STRUCTURED CELL LIBRARY

[75] Inventors: Mossaddeq Mahmood, Santa Clara; Balmukund K. Sharma, Palo Alto; Christopher H. Kingsley, San Jose, all of Calif.

[73] Assignee: VLSI Technology, Inc., San Jose, Calif.

[21] Appl. No.: 339,928

[22] Filed: Nov. 15, 1994

Related U.S. Application Data

[63] Continuation of Ser. No. 877,951, May 1, 1992, abandoned.

[51] Int. Cl.$^6$ .................................................. G06F 17/50
[52] U.S. Cl. ........................... 364/488; 364/489; 364/490
[58] Field of Search ................................. 364/488–491, 364/578

[56] References Cited

U.S. PATENT DOCUMENTS

| | | | |
|---|---|---|---|
| 4,703,435 | 10/1987 | Darringer et al. | 364/489 |
| 4,831,543 | 5/1989 | Mastellone | 364/489 |
| 4,870,598 | 9/1989 | Shaw et al. | 364/491 |
| 4,922,432 | 5/1990 | Kobayashi et al. | 364/490 |
| 5,003,487 | 5/1991 | Drumm et al. | 364/489 |
| 5,005,136 | 4/1991 | Van Berkel et al. | 364/490 |
| 5,146,583 | 9/1992 | Matsunaka et al. | 395/500 |
| 5,150,308 | 9/1992 | Hooper et al. | 364/489 |
| 5,197,016 | 3/1993 | Sugimoto et al. | 364/490 |
| 5,212,650 | 5/1993 | Hooper et al. | 364/489 |
| 5,222,030 | 6/1993 | Dangelo et al. | 364/489 |
| 5,257,201 | 10/1993 | Berman et al. | 364/489 |
| 5,267,175 | 11/1993 | Hooper | 364/489 |

OTHER PUBLICATIONS

Keutzer, Kurt, "DAGON: Technology Binding and Local Optimization by DAG Matching," 24th ACM/IEEE Design Automation Conference, 1987, pp. 341–347.

Marek-Sadowska et al., "Timing Driven Placement," 1989 IEEE, pp. 94–97.

Avra et al., "Behavioral Synthesis of Testable Systems with VHDL," IEEE Computer Society Int'l Conference 1990, pp. 410–415.

Bhasker, "Process Graph Analyzer: A Front End Tool for VHDL Behavioral Synthesis", 1988 Annual Systems Science Int'l Conference, pp. 248–255.

(List continued on next page.)

*Primary Examiner*—Kevin J. Teska
*Assistant Examiner*—Leigh Marie Garbowski
*Attorney, Agent, or Firm*—Flehr, Hohbach, Test, Albritton & Herbert

[57] ABSTRACT

A datapath circuit synthesizer converts an HDL circuit specification into a circuit netlist. The behavioral description of the specified circuit is divided into two distinct parts: datapath logic and control logic. The control logic is implemented in standard cells or gate arrays using a logic synthesizer. The datapath logic is optimally synthesized using a datapath synthesizer having a library of datapath elements, including both structural components and computational components, where some of the computational components are complex circuits having multiple, parallel outputs. Each computational component has associated therewith a set of one or more datapath expressions performed thereby. The received HDL circuit specification is converted into circuit data structures representing the circuit's datapath expressions and structural components. The datapath synthesizer locates all datapath elements in said library matching each such datapath expression and structural component. Then an optimizer determines which datapath expressions can be "combined", or performed by a single library element, so as to reduce the circuit layout area used. The optimizer can combine multiple datapath expressions so as to use datapath circuit elements having multiple parallel outputs. Finally, one library element is selected for each datapath expression, or combined expression, on the basis of circuit area, speed, power or other optimization criteria. Then the connections between the selected circuit components are computed and the resulting circuit is output in the form of a circuit netlist.

6 Claims, 15 Drawing Sheets

OTHER PUBLICATIONS

Chapman et al., "Verified High–Level Synthesis in BED-ROC," 1992 (March) European Design Automation Conference, pp. 59–63.

Chu et al., "HYPER: An Interactive Synthesis Environment for High Performance Real Time Applications," 1989 Int'l Conference on Computer Design; pp. 432–435.

Chu et al., "Hardware Selection and Clustering in the HYPER Synthesis System," European Design Automation Conference (March '1992), pp. 176–180.

Nagasamy et al., "Specification, Planning, and Synthesis," IEEE Design & Test of Computers, vol. 9 IsZ, Jun. 1992, pp. 58–68.

Rabaey et al., "Fast Prototyping of Datapath–Intensive Architectures," IEEE Design & Test of Computers, Jun. 1991, pp. 40–51.

Rundensteiner et al., "Component Synthesis From Functional Descriptions," IEEE Trans. on CAD of ICs and Systems, vol. 12, No. 9, Sep. '93, pp. 1287–1299.

Staus, "Synthesis From Register Transfer Level VHDL," 1989 IEEE Computer Society Int'l Conference, pp. 473–477.

Mahmood, M.; "A Formal Approach to VLSI Control–Unit and Local Microcode Synthesis," University of Waterloo, pp. 60–91, 1990.

Mahmood, M. et al.; "A Formal Language Model of Local Microcode Synthesis," VLSI Design Methods–I, pp. 23–41, Elsevier Science Publishers B.V., 1990.

Pangrle, B. M. et al.; "Design Tools for Intelligent Silicon Compilation," IEEE Transactions on Computer–Aided Design, vol. CAD–6, No1 6, Nov. 1987.

Kahrs, Mark; "Matching a Parts Library in a Silicon Compiler,"; IEEE, CH2353–1/86/0000/0169$01.00, 1986, pp. 169–172.

Mahmood, M. et al.; "A Formal Approach to Control–Unit Synthesis," Department of Electrical and Computer Engineering, Department of Computer Science, University of Waterloo, Waterloo, Ontario, Canada, no date.

Paulin, P. G. et al.; "HAL: A Multi–Paradigm Approach to Automatic Data Path Synthesis," IEEE, 23rd Design Automation Conference, pp. 587–594, no date.

Tseng, Chia–Jeng et al.; "Automated Synthesis of Data Paths in Digital Systems," IEEE. Transactions on Computer–Aided Design, vol. CAD–5, No. 3, Jul. 1986, pp.379–395.

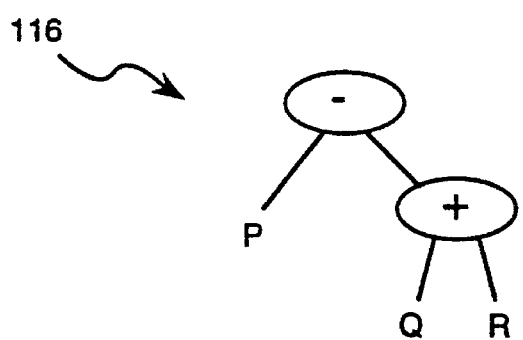
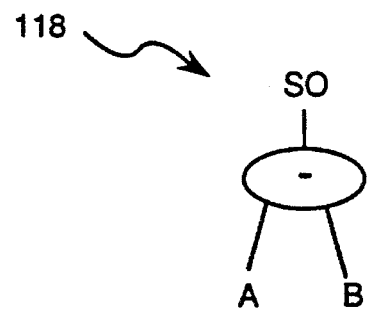
FIGURE 9    FIGURE 10
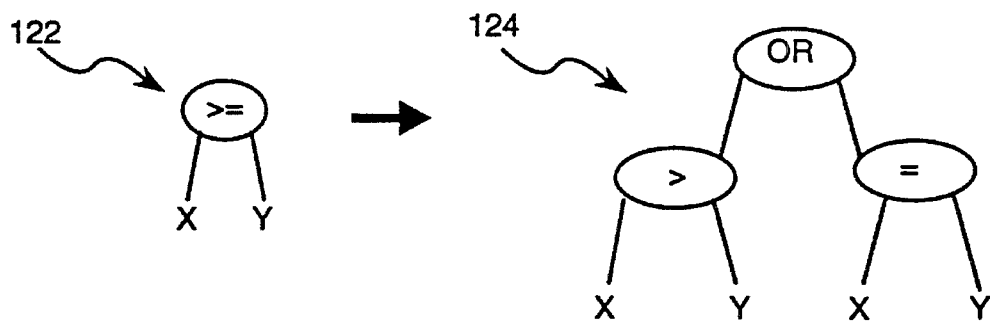
FIGURE 11
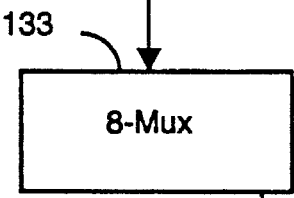
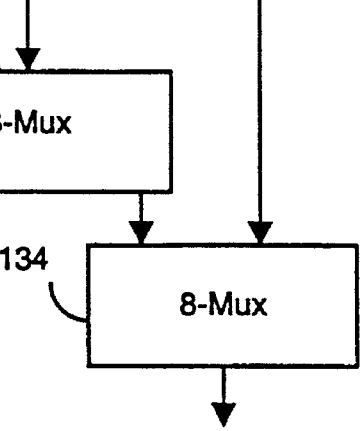
FIGURE 12A
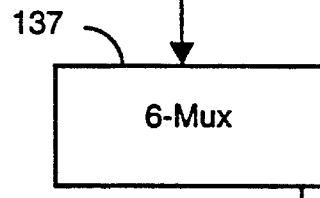
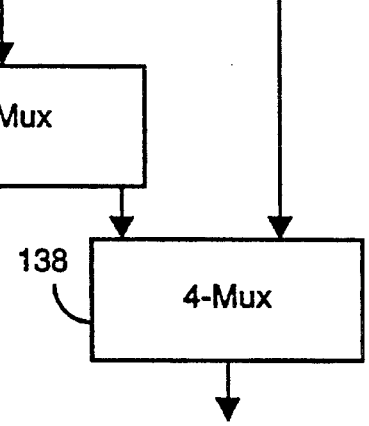
FIGURE 12B

DATAPATH SYNTHESIS METHOD AND APPARATUS UTILIZING A STRUCTURED CELL LIBRARY

This is a continuation of application Ser. No. 07/877,951 filed May 1, 1992, now abandoned.

The present invention relates generally to the Computer Aided Design (CAD) of complex Application Specific Integrated Circuits (ASICs). More particularly, this invention relates to optimizing the design of the datapath portion of an ASIC by providing a structured cell library and by utilizing an improved datapath synthesizer that performs improved circuit element matching and merging operations.

BACKGROUND OF THE INVENTION

Complex ASICs are designed using a variety of CAD tools. One such tool is an HDL circuit simulator for circuits represented by a list of statements in a Hardware Description Language (HDL), such as Verilog or VHDL. The HDL circuit simulator is used to simulate and debug a specified data processing circuit. Typically the HDL description of the circuit is simulated and revised until the circuit designer is satisfied that the specified circuit would work properly.

The object of the present invention is to provide an ASIC synthesizer that synthesizes a circuit netlist from an HDL circuit description using a library of datapath circuit elements (i.e., circuit elements with formal HDL circuit descriptions) and a library of gate elements. A netlist comprises a list of circuit components and the interconnections between those components. Once a netlist has been generated, there are a number of commercially available "silicon compilers", sometimes called "datapath compilers" or "place and route tools," that may then be used to convert the netlist into a semiconductor circuit layout, using a layout cell library of defined circuit elements, or to convert the netlist into a set of interconnections in a gate array. Other CAD tools (such as the COMPASS QTV) may then be used to verify that the resulting circuit layout will, in fact, meet timing requirements or other constraints for the specified circuit.

A primary problem with prior art datapath synthesizers is that the description of the datapath library of elements, used to match HDL statements in the HDL circuit description, have heretofore been ad hoc in nature. In other words, the datapath elements in the prior art have not been defined in a way that allows a general tree-pattern matching between HDL statements and elements in a datapath cell library.

An associated problem or shortcoming of prior art datapath synthesizers is that they cannot synthesize datapaths using complex elements. In the prior art, the functionality of the library cells is limited to a single operation and a single output. However, many circuit elements in commercially useful cell libraries will have multiple outputs and perform complex functions.

Another related problem associated with prior art datapath synthesizers is that they cannot derive operations that do not have a direct mapping to elements in the datapath library. The present invention provides a set of general rules for mapping elements that are not explicitly defined in the datapath library.

Still another problem associated with prior art datapath synthesizers is that they fail to merge complex multi-output circuit elements in an optimal manner.

OBJECTS AND SUMMARY OF THE INVENTION

It is a general object of the present invention to provide an improved datapath synthesis method and apparatus utilizing a structured cell library.

It is a more particular object of the present invention to provide a method and apparatus for formal modeling of a datapath library.

It is another object of the invention to provide a method and apparatus for the synthesis of complex circuit elements.

It is another object of the present invention to provide a datapath synthesizer with improved tree-pattern matching during mapping to datapath library elements.

It is another object of the present invention to provide a method and apparatus for mapping operations that have no direct mapping to datapath library elements.

It is still another object of the present invention to provide a datapath synthesizer with improved element merging operations.

In summary, these and other objects are achieved by an improved ASIC synthesizer that converts an HDL circuit description into a circuit netlist. The behavioral description of the specified circuit is divided into two distinct parts: datapath logic and control logic. The control logic is implemented in standard cells or gate arrays using a logic synthesizer. The datapath part is optimally synthesized using a datapath synthesizer.

The datapath synthesizer includes a library of structural components and datapath elements, including datapath elements having multiple, parallel outputs. The library is a set of library data structures including cell data structures that store data representing for each library datapath element a set of one or more datapath expressions performed thereby.

The input to the datapath synthesizer is a datapath circuit specification for a datapath circuit performing a specified set of data processing operations. The received circuit specification is stored in a set of circuit data structures representing datapath expressions and structural components to be included in the specified datapath circuit. The datapath synthesizer locates all elements in the library, matching each of the datapath expressions and structural components to be included in the specified datapath circuit. Then an optimizer determines which datapath expressions can be "combined", or performed by a single library cell, so as to reduce the circuit layout area used. The optimizer can combine multiple datapath expressions so as to use datapath circuit elements having multiple parallel outputs. Finally, after the optimization process, there may still be multiple library cells that can be used to implement ones of the circuit's datapath expressions. One cell for each expression or set of combined expressions is selected on the basis of circuit area, speed, power or other criteria. Then the connections between the selected circuit components are computed and the resulting circuit is output in the form of a circuit netlist, suitable for use in a circuit simulator (such as COMPASS SIM or COMPASS QSIM), or a place and route tool such as the COMPASS Chip Compiler or the COMPASS Gate Compiler.

BRIEF DESCRIPTION OF THE DRAWINGS

For a better understanding of the nature and objects of the invention, reference should be had to the following detailed description taken in conjunction with the accompanying drawings, in which:

FIGS. 9 and 10 illustrate examples of matching tree-patterns associated with an element of a specified circuit and an element in a structured library.

FIG. 11 illustrates an example of algebraic transformation.

FIGS. 12A and 12B depicts two examples of cascaded multiplexers.

Like reference numerals refer to corresponding parts throughout the several views of the drawings.

DETAILED DESCRIPTION OF THE INVENTION

Figure 1:
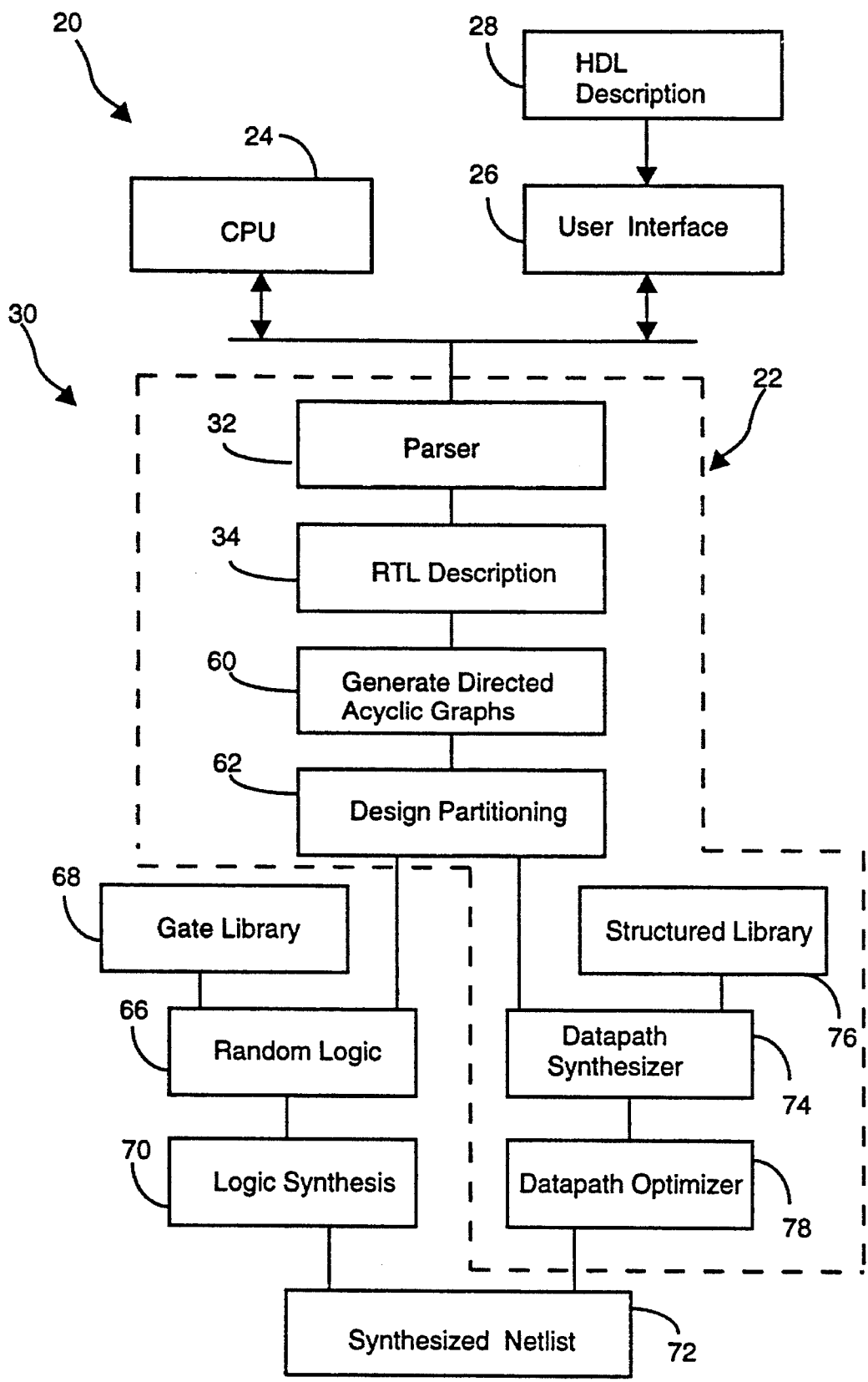
FIG. 1 is an ASIC synthesizer incorporating the datapath synthesizer of the present invention.

FIG. 1 depicts an ASIC synthesizer 20 that incorporates the datapath synthesis elements 22 of the present invention. The ASIC synthesizer 20 includes a general purpose CPU 24 that is coupled to a user interface 26. The user interface 26 is suitable for receiving a hardware description of a test circuit 28 and for conveying a synthesized netlist to a user. Thus, the user interface 26 may comprise a keyboard and computer monitor, or any other suitable combination of computer peripheral devices. The CPU 24 operates in conjunction with data and instructions stored in memory 30, which may be any combination of RAM, ROM, or disc storage.

The software stored in memory 30 includes a parser 32 that translates the HDL (hardware description language) circuit description 28 into an intermediate Register Transfer Level (RTL) structure 34 corresponding to the circuit. The hardware description language used for the circuit description 28 is preferably in the form of a commercially available language such as Verilog or VHDL. Verilog is a commercial product sold by Cadence Design, San Jose Calif.; VHDL is an IEEE standard HDL which is known in the art. By way of example, the VHDL description of the two gates of FIG. 2 would be as follows:

```
entity vdp50ai004 is
  port(A1, A2, B: IN std_logic_vector(3 downto 0);
    ZN: OUT std_logic_vector(3 downto 0);
  end vdp50ai004;
  architecture vdp50ai004 of vdp50ai004 is
  begin
  process(A1, A2, B) begin
    ZN <= (A1 or A2) nand B;
  end process
  end vdp50ai004;
```

Figure 2:
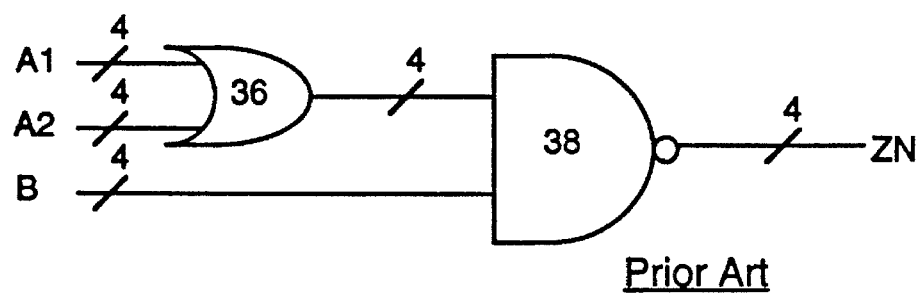
FIG. 2 depicts a multiple input, single output hardware structure that may be modeled in a hardware description language.

As depicted in FIG. 2, input signals A1 and A2 are conveyed to an OR gate 36. The output of OR gate 36 and input signal B are conveyed to NAND gate 38, yielding output ZN. The logical expression "$ZN \leq (A1 \text{ or } A2) \text{ nand } B$"

reflects the functionality of the coupled OR gate 36 and NAND gate 38. The remaining code in the above VHDL circuit description complies with the formalities of the VHDL language. First, an "entity" is described, in this case, the hardware components of FIG. 2 are identified as "vdp50ai004". The "port" field lists all the external ports associated with a hardware element. In the example provided, A1, A2, and B are identified as 4 bit vector input ports, while ZN is identified as a 4-bit vector output port.

More complicated hardware components that are not standard items in a given library may also be modeled in a language such as HDL. For instance, the components of FIG. 3, may also be modeled in HDL. The hardware components of FIG. 3 receive an input "a" and "b" signal, and dependent upon the select ("sel") signal, either add or subtract these values. The output "sig1" is conveyed to an instance of a D-type flip-flop ("Inst1 of DFF") and generates an output "Outp1" signal. Simultaneously, input "c" and "d" signals are subjected to a XOR operation to generate an output "Outp2" signal. A VHDL description of these components is:

```
entity addsubff is
  port (sel : in bit;
    a,b,c,d : in bit_vector(7 downto 0);
    clk,rst : in bit;
    outp1,outp2 : out bit_vector( 7 downto 0)
  end addsubff;
  architecture addsubff of addsubff is
  signal sig1 : bit_vector(7 downto 0);
  begin
    inst1:dff port map(d => sig1,q => outp1,clk => clk,
    rst => rst);
    outp2 >= c xor d;
    process(sel,a,b)
      begin
      if sel = '1' then
        sig1 <= a + b;
      else
        sig1 <> a − b;
      end if;
    end process;
  end addsubff;
```

Figure 3:
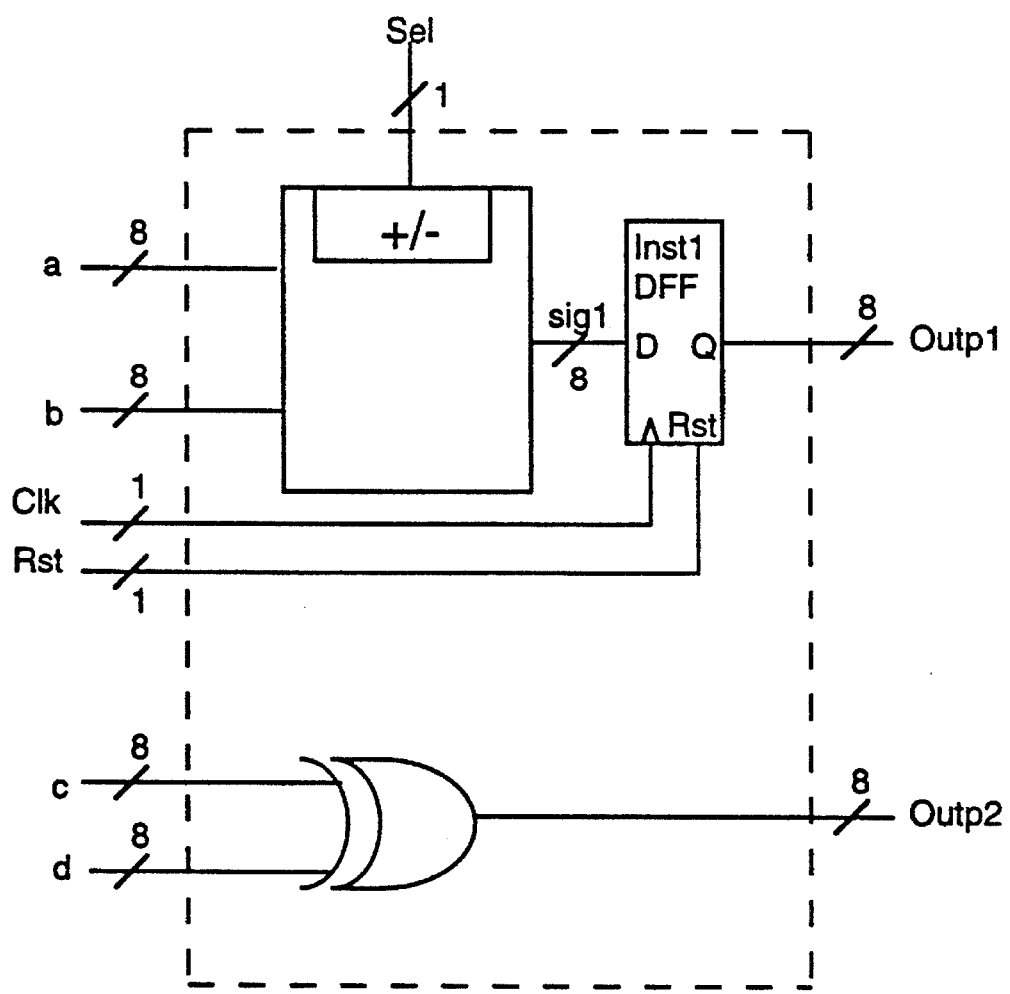
FIG. 3 depicts a multiple input, multiple output hardware structure that may be modeled in a hardware description language.

The components of FIG. 3 are identified in the above HDL code as an entity "addsubff". The "port" field lists all the external ports declared in the entity. These include the input ports (a,b,c,d) that are defined as 8 bit vector values, a select bit (sel) for selecting the add or subtract operation, a clock (clk) and reset (rst) bit, and two output ports (outp1, outp2) that are defined as 8 bit vector values. The "signal" field lists the internal signals described in the architecture. In this case, "sig1", an 8 bit vector value.

The "inst" field lists instances of predefined circuit structures, such as flip-flops, to be used in the described circuit. In this example, "inst1" is an instance of a defined circuit component called "dff". The port map associated with this component specifies that the internal signal "sig1" is connected to port "d" of component "dff", while output signal "outp1" is connected to output port "q" of component "dff", and so forth.

It should be noted that the HDL description of the component "addsubff" includes a number of logical expressions: A+B, A−B, C XOR D, sel='1', and "IF", The significance of the identification of these logical and mathematical expressions will be described below.

In accordance with the invention, the HDL description of each component of the circuit is transformed by the Parser 32 into an intermediate Register Transfer Level (RTL) structure corresponding to the component. This intermediate data structure defines important attributes of the corresponding hardware element.

Figure 4:
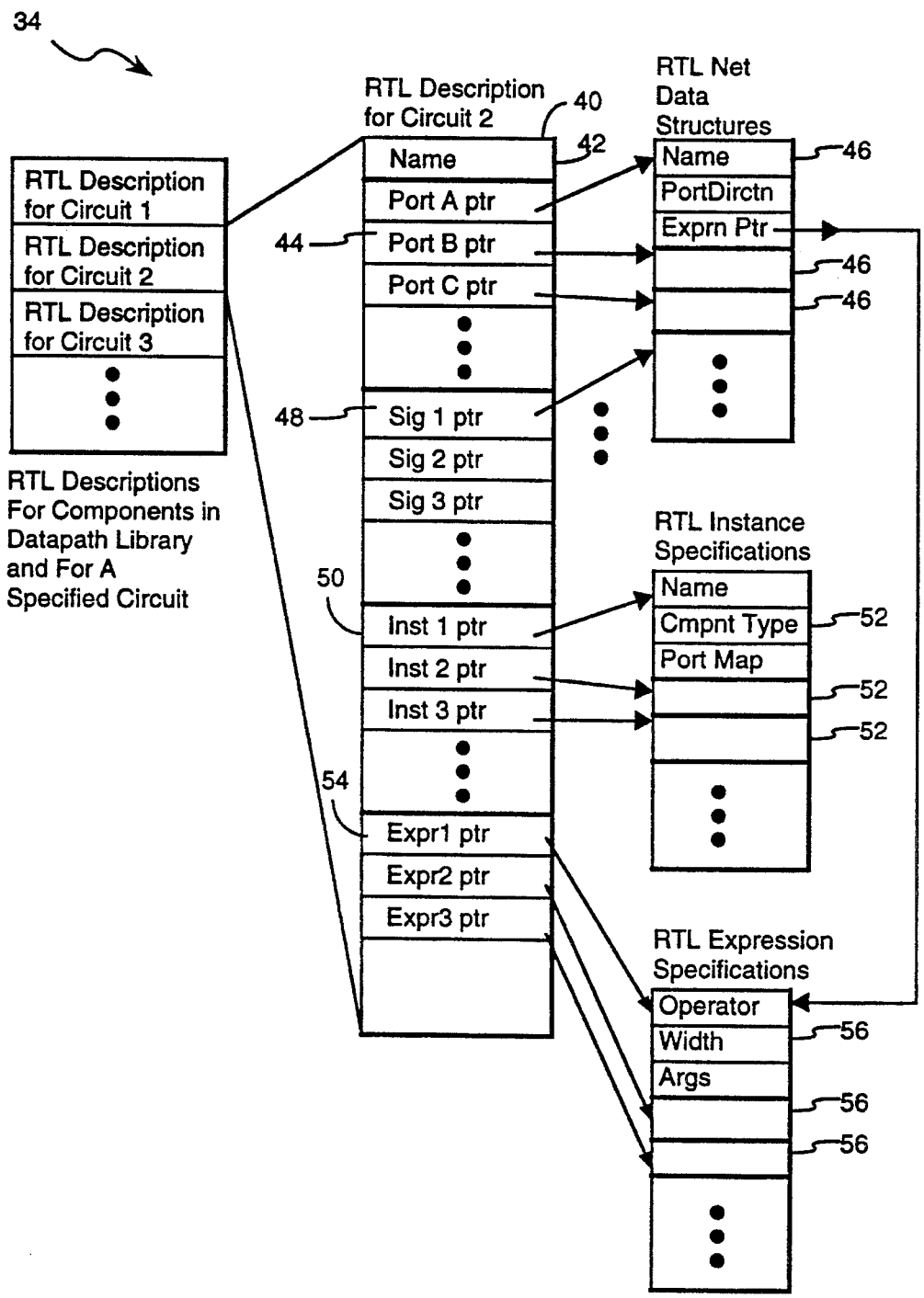
FIG. 4 is a block diagram of the intermediate RTL structure of a circuit and its relation to datapath library elements.

Referring to FIG. 4, the RTL data structure 34 for representing both the circuit to be synthesized, as well as for representing the circuits in the structured library of defined components, is defined as follows. For each defined circuit component, one record 40 (of type RTL) is created having the following fields:

```
class RTL is (
    string name;
    pointer (List) ports;
    pointer (List) sigs;
    pointer (List) insts;
    pointer (List) exprs;
);
```

The name field 42 in the RTL record (data structure) is a string of characters representing the name of a circuit component, such as "addsubff" for the circuit described above with respect to FIG. 3. The "ports" field 44 in the RTL data structure is a list of pointers to RTL Net data structures 46 representing the circuit's input and output ports. Similarly, the "sigs" field 48 in the RTL record is a list of pointers to RTL Net data structures 46 representing internal nodes in the circuit. The "insts" field 50 is a list of pointers to RTL Instance specification records 52, each of which defines one instance of a library circuit component. Finally, the "exprs" field 54 is a list of pointers to RTL Expression specification records 56, each of which defines one logical or mathematical expression.

The RTL Net record (data structure) 46 used to represent each port and internal node has the following data structure:

```
class rtlNetClass (
    string netName;
    bits portDirection;
    pointer (rtlExprClass) expr;)
``` where the "netName" field is the name of a port or node (such as "a", "Clk", or "Outp1" for the circuit of FIG. 3), the "portDirection" field is a bit vector value that identifies a port, for instance as an input or output port, and the "expr" field is a pointer to an RTL Expression specification record 56 for a value of an output port or an internal node, in this example, "Outp1", "Outp2", and "sig1".

The HDL port description for the circuit of FIG. 3 is defined as follows:

```
port (sel: in bit;
    a,b,c,d: in bit_vector(7 downto 0);
    clk, rst: in bit;
    outp1, outp2: out bit_vector (7 downto 0))
```

The corresponding RTL description would include a separate RTL Net record 46 for each of the ports listed in the HDL description.

The RTL Instance Specification record (data structure) 52 includes fields indicating the instance name (an example of which is "inst1"), the component type (such as DFF) of which this is an instance, and a port map (an example of which is "d≧sig1, q≧outp1, clk≧clk, rst≧rst") that indicates the nodes to which the component instance is connected.

The RTL Expression specification record (data structure) 56 is used to define logical and mathematical expressions such as A+B, A−B, C XOR D, sel='1', and "IF". Each expression is defined by an operator, signal width, and list of arguments (i.e., signals or nodes). The structure of record 56 is defined as:

```
class rtlExprClass (
    integer operator;
    integer width;
    pointer (list) arguments);
```

Expressions can have other expressions as inputs forming an expression tree called a Directed Acyclic Graph (DAG). In the prior art, DAGs are derived from the HDL description of an element. In accordance with the present invention, DAGs are generated from the RTL description of an element (block 60 in FIG. 1 ).

Figure 5:
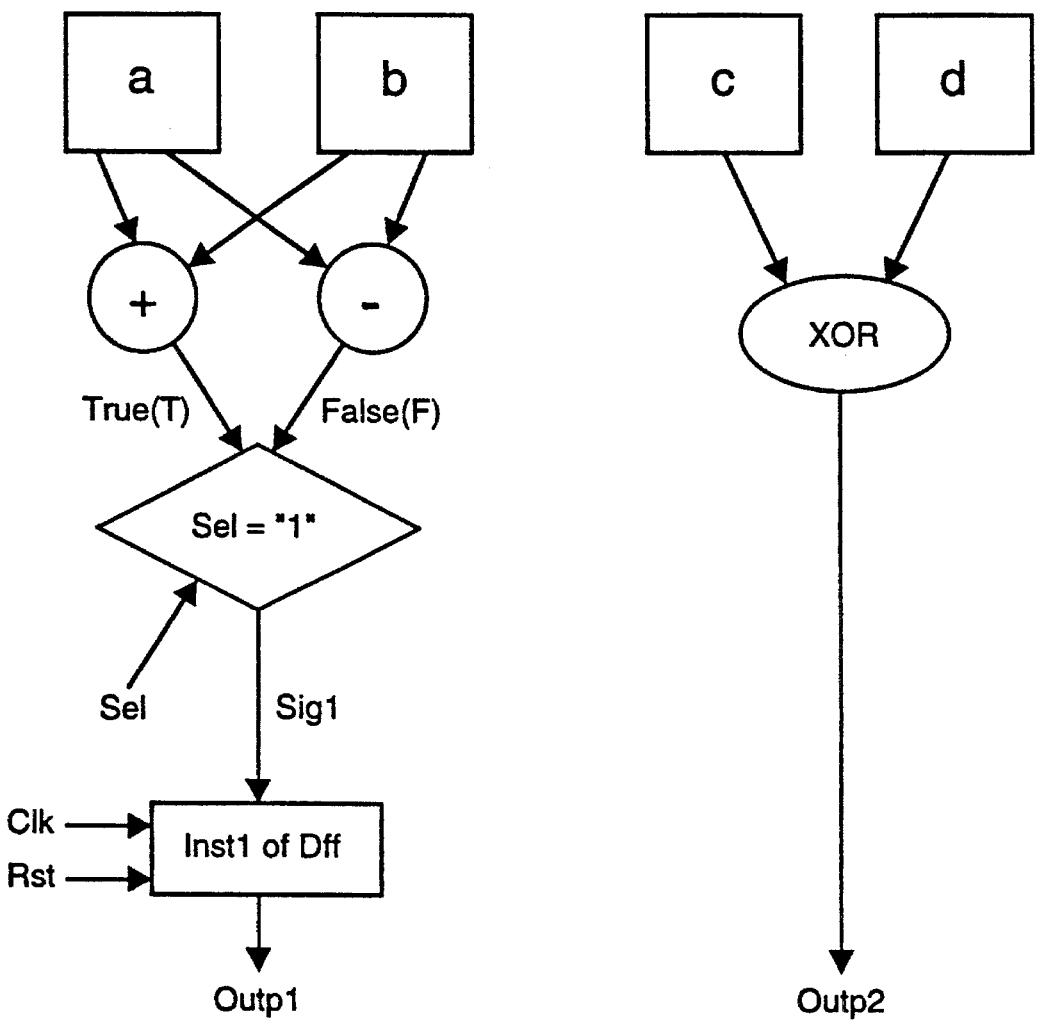
FIG. 5 depicts a Directed Acyclic Graph corresponding to the hardware structure of FIG. 3.

FIG. 5 depicts the DAGs corresponding to the "addsubff" structure of FIG. 3. Expression trees are formed by creating expressions from input ports and intermediate signals. In this example, signals are provided by input ports "a", "b", "c", and "d", and by intermediate signal "sig1". Operations are performed by expressions such as "+", "−", or "XOR". Note that the value of "Outp1" is the same as the output port Q of instance "inst1" of component "dff" in the above HDL circuit description.

Figure 6:
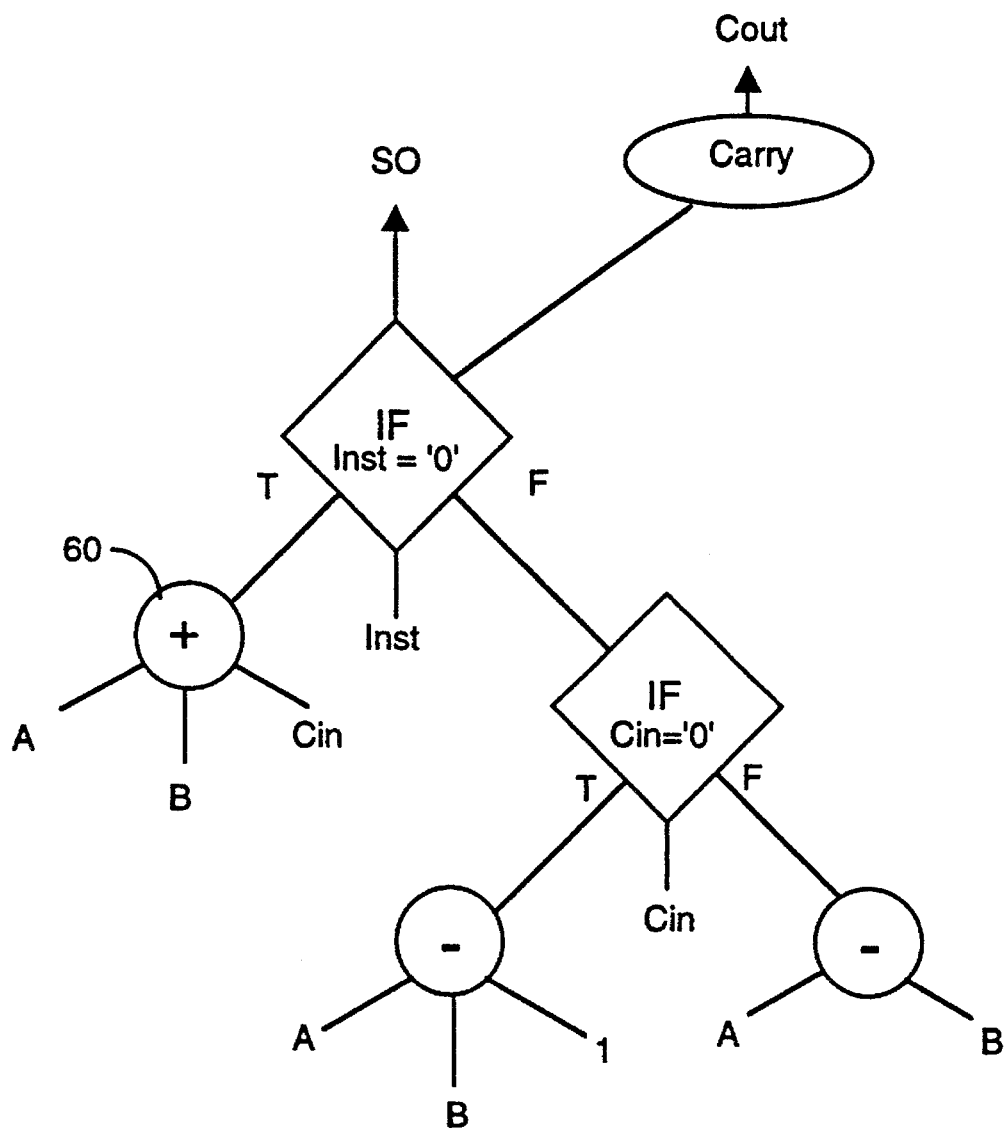
FIG. 6 depicts a Directed Acyclic Graph corresponding to an addition/subtraction unit.

FIG. 6 shows another example of a DAG for an addition/subtraction unit that is described in HDL as follows:

```
entity vdp1asb001 is
    port (A, B: IN std-logic-vector (3 downto 0);
    SO, STATUS: OUT std-logic-vector (3 downto 0);
    CIN: In std-logic
    INST: IN std-logic;
    COUT: OUT std-logic);
end vdp1asb001;
architecture vdp1asb001 of vdp1asb001 is
    begin
    process(A, B, CIN, INST) begin
    if INST = '0' then
        SO <= A + B + CIN
        COUT <= CARRY(A + B + CIN);
    else if CIN = '0' then
        SO <= A − B − '1';
        COUT <= CARRY(A − B − '1');
    else
        SO <= A − B
        COUT <= CARRY(A − B);
```

```
        end if;
      end if;
    end process;
  end vdp1asb001;
```

Using the RTL definitions previously discussed, it will be recognized that a number of RTL expressions are present in this HDL code. Namely, there are two "if" expressions, two minus ("−") expressions, and two plus ("+") expressions. In addition, there are a number of operands, or input values, including: A, B, CIN, and INST. The expressions take the operands and yield two outputs: SO (SumOut) and COUT (CarryOut). This information may be transformed into the DAG depicted in FIG. 6.

Returning to FIG. 1, after the Directed Acyclic Graphs are generated (block 60), the present invention employs the step of Design Partitioning (block 62). Given a design description that is converted to an RTL Description (block 34), with each output having a value that is described as a DAG (block 60), the design is partitioned (block 62). Two types of partitioning are employed. First, random logic is partitioned from datapaths. Next, datapaths are partitioned based upon their signal widths. That is, expressions with the same width are grouped into a single datapath. Using the examples of FIGS. 3 and 5, "a+b", "a−b", "C XOR D", and the "IF" statement can be efficiently implemented in an 8 bit datapath. For instance, "a+b" and "a−b" can be implemented using datapath adders/subtracters, "C XOR D" can be implemented using an 8 bit datapath XOR gate.

In the prior art, irregular data paths are compiled, wasting area. The present invention reduces layout area by partitioning the datapath into several smaller datapaths based on the width of the expression.

Those elements of the specified circuit that must be implemented using random logic are partitioned from the datapath elements, resulting in a listing of boolean expressions representing the random logic elements 66, each of which is mapped to one or more circuit elements in a logic gate library 68. For example, the one bit expression "sel= '1'" may be implemented using simple random logic gates. The random logic elements 66 are mapped into logic gates by the logic synthesizer 70, thereby producing the logic gate portion of the synthesized netlist 72 for the specified circuit. Logic synthesis is well known to those skilled in the art, and logic synthesizer 70 is implemented using commercially available logic synthesizer software, such as the COMPASS Logic Synthesizer from COMPASS Automation Design, San Jose, Calif.

The datapath portion of the synthesized netlist 72 is generated by a datapath synthesizer 74 that utilizes structured library 76. It should be noted that the contents of the structured library 76 are generated by performing the same sequence of parsing and graphing steps 32, 34, 60 as described above, except as applied to an HDL model for all the circuit elements to be included in the library 76. This will be discussed in more detail below with regard to FIGS. 7 and 8.

The datapath structure 142 generated by the datapath synthesizer 74 is further processed by the datapath optimizer 78 to produce an optimized set of library cells for implementing the specified circuit. The resulting set of cells is then processed by a datapath connection routine so as to generate the lists of cell interconnections required to produce synthesized net list 72. Attention will now turn to the datapath synthesizer 74, structured library 76, and data path optimizer 78 of the present invention.

Figure 7:
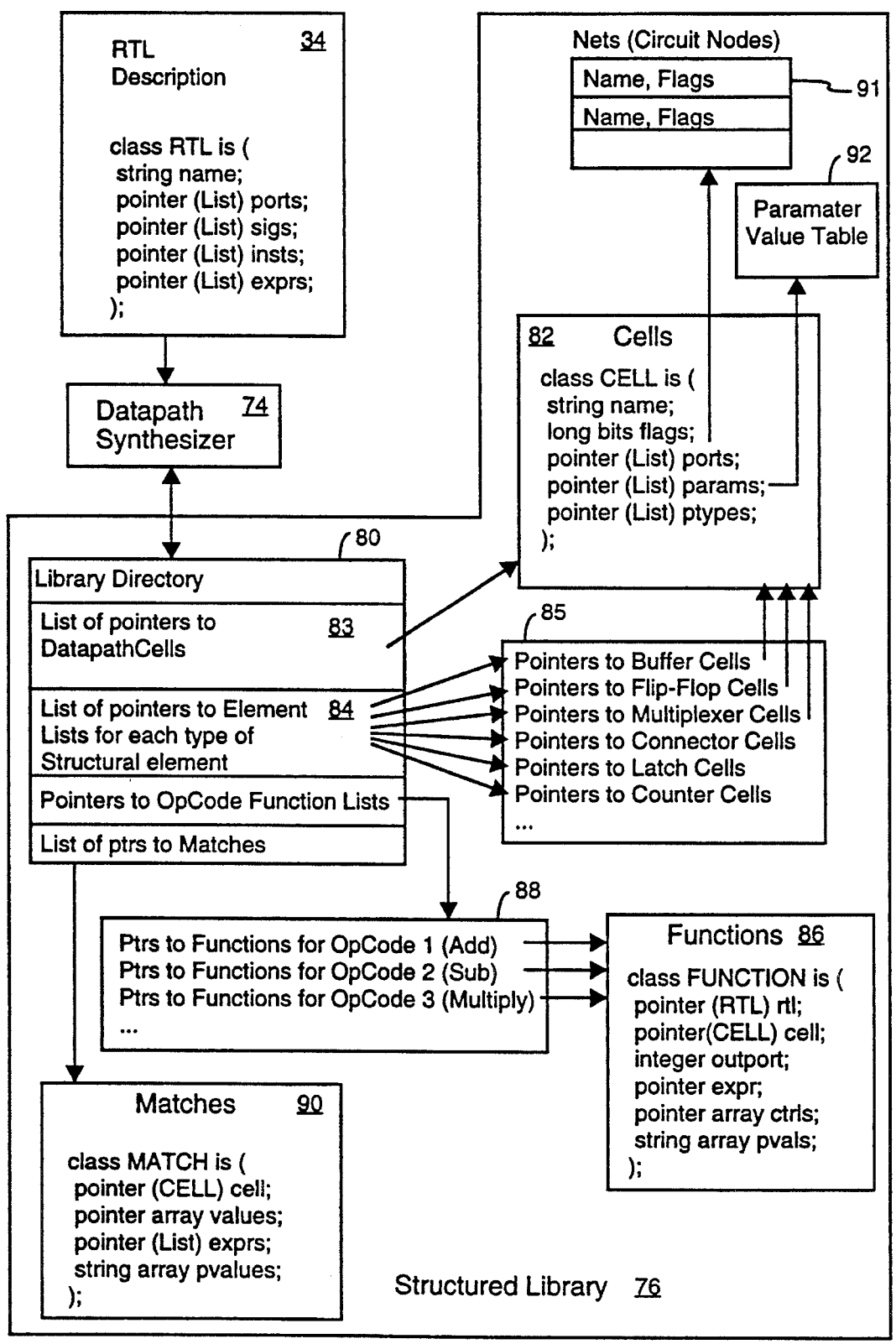
FIG. 7 depicts the data structure used in the structured library of the preferred embodiment.

As shown in FIG. 7, the structured library 76, utilized by the datapath synthesizer 74 during circuit synthesis, has a library directory 80, Cell data structures 82, Function data structures 86, and Match data structures 90. The present invention uses a structured format to accommodate a variety of library elements. The structured library format of the present invention is defined as follows:

```
class NET is (
    string name;
    long bits flags;
);
class CELL is (
    string              name;
    long bits           flags;
    pointer (List)      ports;
    pointer (List)      params;
    pointer (List)      ptypes;
);
class FUNCTION is (
    pointer (RTL)       rtl;
    pointer (CELL)      cell;
    integer             outPort;
    pointer             expr;
    pointer array       ctrls;
    string array        pvals;
);
class MATCH is (
    pointer (CELL)      cell;
    pointer array       values;
    pointer (List)      exprs;
    string array        pvals;
);
```

The "NET" structure 91 stores a "name" of a port of a circuit element. The "NET" structure also stores "flags" which describe properties associated with the port, such as input or output, data or control, and width of a port.

The "CELL" structure 82 specifies the components and properties of a datapath cell. The "name" field identifies the datapath cell. The "flags" field contains a set of bit flags used to specify properties of each cell. For instance, one flag may be defined to indicate that the cell's outputs are inverted, another indicating the ability to have tri-stated outputs, and so on. The "params" field lists (through a set of pointers) the names of parameters, if any, used by the cell. The "ptypes" field contains a corresponding list of the types of the parameters in the "params" field.

The library directory 80 contains a first list 83 of cell pointers for datapath elements that perform computations. The library directory 80 also contains a second list 84 of pointers to cells lists 85 for structural components (i.e., datapath elements used for data storage, buffering, interconnects, etc.). Thus there will be one pointer in 84 for buffer cells, one for flip-flop cells, etc. Each list in 85 contains the pointers to all the cells of the corresponding type.

The "FUNCTION" structure 86 stores information defining how a datapath library element performs an operation. The "rtl" field points to the RTL structure of a datapath library element (such as vdp1asb001). Similarly, the "cell" field points to the CELL structure for the same datapath library element. The "expr" field stores the RTL expression (say A+B) that is computed by this datapath element (that is, vdp1asb001) at port position "outPort". The "ctrls" field stores the values of the control signals for the list of ports in the "ports" field of the CELL structure which is required to compute operation "expr" by this datapath element. Similarly, the "pvals" field stores the values of the boolean parameters corresponding to the list of parameters in the "params" field of the CELL structure which is required to compute operation "expr" by this datapath element. When the operation does not require control signals and boolean parameter values (such as AND, XOR, and OR gates), the "ctrls" and "params" fields have empty or null values. The "expr" field of each FUNCTION record is the tree-pattern used by the Operation Mapper, to be described below, for determining the port mapping values.

The "MATCH" structure 90 stores values indicating which cell structures can be used to perform a given function. In other words, the "MATCH" structure stores information indicating which elements within the library can perform a given function such as "A+B". The "cell" field in the match structure is a pointer to the datapath element in the library that can perform the given function. The "values" field stores the port mapping values that are required to perform this function. The "pvalues" field stores the parameter values that are required to perform this function. As will be more fully described below, the MATCH structure is dynamically created by the Operation Mapper and Instance Mapper, and is used by the Datapath Synthesizer for synthesizing the resultant datapath structure.

Other data structures in the library 76 include Nets 91 and Parameter Values 92. There is one Net data structure 91 for describing every port of every cell, and one Parameter value data structure 92 for each cell. Some cells perform somewhat different functions depending on parameter values assigned to the cell, and the parameter values in structure 92 indicate defined parameter values for each cell. For many cells, the parameter list is empty. The Net 91 data structure provides the port's name, and a set of bit flags that specify the port's type (input, output, control, etc.) and the port's path width. An example of the schema for the bit flags is as follows:

| Bit# | Description |
|---|---|
| 0 | =1 for input port |
| 1 | =1 for output port |
| 2 | =1 for control signal |
| 3 | =1 for inverted signal |
| 4 | =1 for tristate |
| ... | ... |
| 8–15 | Binary value of port width. |

The following is a listing of an example of the data structures found in the structured library format as applied to the add/subtract unit defined above in relation to FIG. 6:

```
class CELL (
  name: VDP1ASB001
  ports: (A, B, SO, Status, CIN, INST, COUT)
  params: (empty-list)
  ptypes: (empty-list)
);
class FUNCTION (
  cell: VDP1ASB001 cell
  outPort: 3
  expr: A + B + CIN
  ctrls: (nil, nil, nil, nil, nil, 0, nil)
  pvals: (empty-list)
);
class FUNCTION (
  cell: VDP1ASB001 cell
  outPort: 3
  expr: A + B
  ctrls: (nil, nil, nil, nil, 0, 0, nil)
  pvals: (empty-list)
);
class FUNCTION (
  cell: VDP1ASB001 cell
  outPort: 3
  expr: A + B + 1
  ctrls: (nil, nil, nil, nil, 1, 0, nil)
  pvals: (empty-list)
);
class FUNCTION (
  cell: VDP1ASB001 cell
  outPort: 3
  expr: A − B − 1
  ctrls: (nil, nil, nil, nil, 0, 1, nil)
  pvals: (empty-list)
);
class FUNCTION (
  cell: VDP1ASB001 cell
  outPort: 3
  expr: A − B
  ctrls: (nil, nil, nil, nil, 1, 1, nil)
  pvals: (empty-list)
);
class FUNCTION (
  cell: VDP1ASB001 cell
  outPort: 7
  expr: CARRY(A + B + CIN)
  ctrls: (nil, nil, nil, nil, nil, 0, nil)
  pvals: (empty-list)
);
class FUNCTION (
  cell: VDP1ASB001 cell
  outport: 7
  expr: CARRY(A + B)
  ctrls: (nil, nil, nil, nil, 0, 0, nil)
  pvals: (empty-list)
);
class FUNCTION (
  cell: VDP1ASB001 cell
  outport: 7
  expr: CARRY(A + B + 1)
  ctrls: (nil, nil, nil, nil, 1, 0, nil)
  pvals: (empty-list)
);
class FUNCTION (
  cell: VDP1ASB001 cell
  outPort: 7
  expr: CARRY(A − B − 1)
  ctrls: (nil, nil, nil, nil, 0, 1, nil)
  pvals: (empty-list)
);
class FUNCTION (
  cell: VDP1ASB001 cell
  outPort: 7
  expr: CARRY(A − B)
  ctrls: (nil, nil, nil, nil, I,1, nil)
  pvals: (empty-list)
);
```

The FUNCTION structures listed above are derived from the DAG of FIG. 6 by partially evaluating the DAG with respect to control port values of "CIN" and "INST". The "ctrls" indicate the values of the control signals (e.g., "Inst" and "Cin") required by "cell" (e.g., vdp1asb001) to perform "expr" (e.g., A+B) at "outPort" (e.g., "SO").

The expressions from the "FUNCTION" structures may be placed into a function table 88 which corresponds to the datapath element "vdp1asb001". A function table for this element would be as follows:

| Operation | Control Signals | |
|---|---|---|
|  | INST | CIN |
| SO <= A + B + CIN | 0 | X |
| SO <= A + B | 0 | 0 |
| SO <= A + B + 1 | 0 | 1 |
| SO <= A − B − 1 | 1 | 0 |
| SO <= A − B | 1 | 1 |
| COUT <= CARRY(A + B + CIN) | 0 | X |
| COUT <= CARRY(A + B) | 0 | 0 |
| COUT <= CARRY(A + B + 1) | 0 | 1 |
| COUT <= CARRY(A − B − 1) | 1 | 0 |
| COUT <= CARRY(A − B) | 1 | 1 |

Figure 8:
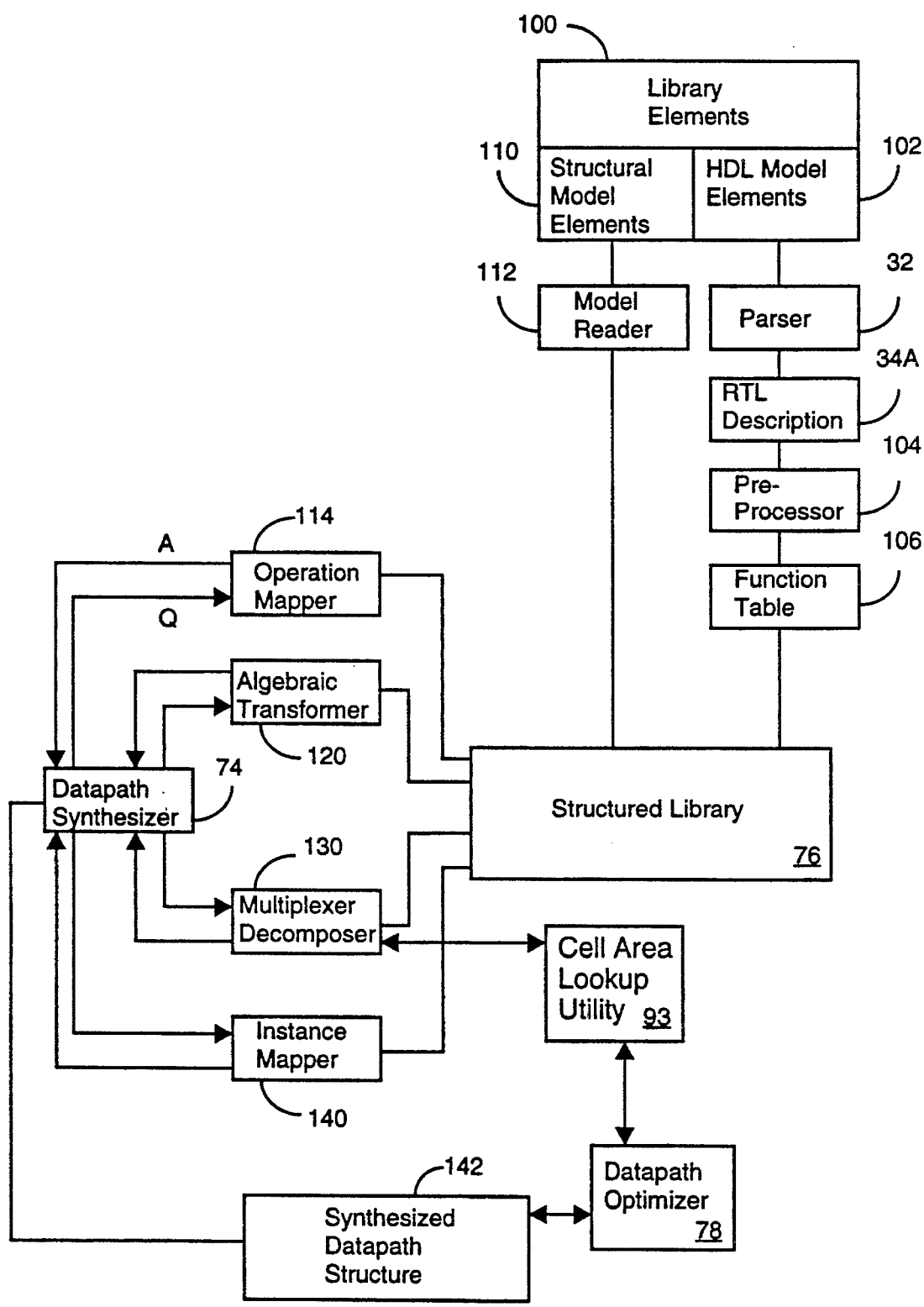
FIG. 8 is a more detailed depiction of the datapath synthesizer.

Referring to FIG. 8, the structured library 76 is loaded with a library of elements 100 that are mapped into the structured library data format. In particular, the structured library 76 receives two types of elements. The HDL model elements 102 correspond to circuit hardware elements that are defined in a hardware description language such as VHDL. These library elements are processed by Parser 32 to generate an RTL description 34A, as previously discussed in relation to FIG. 1. However, unlike the system of FIG. 1, a preprocessor 104 is employed to further map the RTL description 34A of the HDL elements into a function table 88 that contains a list of operations performed by the datapath elements 102 and their corresponding control signal values. An example of a portion of the function table 88 was provided above in relation to element "vdp1asb001".

The library elements of the invention also include structural model elements 110. A model reader 112 takes structural model elements 110 and maps them into the data structure of the structured library 76. The model elements 110 are generally simple circuit elements that are conducive to direct mapping into the library 76. The HDL description of each such element includes a cell type (such as buffer, latch, flip-flop, etc.) an alpha-numeric identification, a description of the properties of a cell, and a description of the ports of a cell. For example, consider a simple non-inverting three state buffer with a bus-controlled enable. The input signal is "I", the output signal is "Z", and the enable signal is "OE". This model element is defined in the structural model language as follows:

```
begin Cell buffer VDP36SBT03
  drive 3
  speed med
  type triBusEnable
  net I din width=4 pos=0
  net Z dout width=4 tri=yes
  net OE busenable width=1 value=high
endcell
```

"Buffer" is the type of cell, while "VDP36SBT03" is the name of the cell. The cell is also identified as a sub-type with "triBusEnable". Properties of the cell include medium speed and an output drive capability of "3" (i.e., it can handle a fanout to three cell input ports). Each port is identified with a "net" characterization. For instance, "net OE" is the "busenable", which is a one bit value (width=1) that is enabled on a high input (value=high).

This element is mapped into the previously defined library data structure as follows:

```
structure CELL is (
  name: VDP3TSBT03
  flags: buffer, three-state, non-inverting
  ports: (I,OE,Z)
  params: (empty-list)
  p-types: (empty-list)
);
```

Model elements 110 are mapped to cell structures 82, while the RTL descriptions 34A of HDL elements are mapped to cell structures 82 and function structures 86. The function table 88 is a list of function structures 84, partitioned by operator type. In particular, the library directory 80 contains one "function list" pointer for each type of datapath operator, such as ADD, SUB, MULTIPLY, and so on, that points to a list 88 of functions 86. The datapath synthesizer 74 can efficiently find all function structures 84 corresponding to a specified operator, by following the directory pointer for the specified operator to the corresponding list 88 of function pointers, and then accessing only the function structures 86 for the specified operator.

As will be described below, match structures 90 are generated by the Operation Mapper 114 and Instance Mapper 140 in conjunction with the datapath synthesizer 74. In particular, the datapath synthesizer 74 compares the RTL description of a specified circuit's elements to the elements within the library 76. The match structures 90 identify library elements that can perform the operations defined by a given RTL description of a specified circuit element. From the list of matched or available structures, selections are made to optimize the resulting circuit with respect to certain circuit characteristics, such as area, speed or power consumption.

Referring again to FIG. 8, the datapath synthesizer 74 uses the structured library 76 to generate the match structures 90 as follows. An operation mapper 114 maps each behavioral operation of a specified circuit (i.e., the circuit to be synthesized) to one or more cells within the structured library 76. This mapping is performed by matching tree structures associated with the RTL description of the specified circuit's elements with tree structures associated with the elements of the structured library 76. In particular, the tree structures associated with the DAGs of the RTL description of the specified circuit are matched with the tree structures associated with the DAGs stored in the library's Function structures 86.

For instance, FIG. 9 depicts a tree pattern 116 that needs to be matched with elements in the library 76. The tree pattern 116 corresponds to a DAG derived from an RTL description. For instance, FIG. 5 includes a number of branches that may be decomposed into structures analogous to tree pattern 116.

The tree pattern 116 is compared by the operation mapper 114 (FIG. 8) with elements within the structured library 76 to ascertain which elements within the structured library may be used to execute the function defined by the tree pattern 116. In particular, the datapath synthesizer 74 queries the operation mapper 114 about items within the structured library 76. The operation mapper 114 examines the elements within the structured library 76 and returns a list of library elements that may be used to execute the operation. For instance, FIG. 10 depicts a tree structure 118 for a library element that corresponds to a portion of the tree structure 116 in FIG. 9. In this example, the tree structure 118 is an RTL representation of an HDL library element VDP1ASB002. The structured library representation of this element is as follows:

```
structure CELL is (
  name: VDP1ASB002
  flags:
  ports: (A, B, SO, STATUS, INST-SA, INST-SB,
    INST-CIN, INST-COUT)
  params: (empty-list)
  ptypes: (empty-list)
);
structure MATCH is (
  cell: VDP1ASB002
  values: (P, Q + R, P − (Q + R), nil, 0, 1, 1, nil)
  exprs: (empty-list)
  pvalues: (empty-list)
);
```

The above "MATCH" structure indicates that the value "A" of the cell library element maps to the value "P" in the tree structure 116, while the value "B" of the cell library element maps to the value "Q+R" of the tree structure 116.

In the simple example provided in relation to FIG. 9, the operation mapper 114 would typically identify a large number of matches (i.e., elements in the library that can perform the function diagramed in FIG. 9) for the structure. The selection of a particular matched item will be discussed below.

Tree pattern matching is facilitated by use of a common RTL structure for both the specified circuit and the library elements, which enables the present invention to efficiently and correctly identify potential matching structures.

As shown in FIG. 8, the present invention also employs an algebraic transformer 120. The Algebraic Transformer 120 is run prior to the tree pattern matching performed by the operation mapper 114. In particular, the algebraic transformer 120 inspects the operators in every expression for the specified circuit. If an expression has an operator not matched by any of the Functions in the library 76, the algebraic transformer 120 transforms the unmatched operator structure, using a set of "algebra" rules, into an equivalent expression that has a direct mapping to structures within the library 76.

FIG. 11 depicts an example of this operation. Tree structure 122 tests whether "X" is greater than or equal to "Y". If the structured library 76 does not have any elements which match this tree structure, the algebraic transformer 120 uses a predefined set of algebraic rules to generate a functionally equivalent structure 124. Tree structure 124 is functionally equivalent to tree structure 122. In this example, tree structure 124 will determine whether "X" is greater than or equal to "Y" by ascertaining if "X" is greater than "Y" or if "X" is equal to "Y".

Thus, in accordance with the invention, the algebraic transformer 120 is used to generate algebraically equivalent tree structures for unmatched RTL tree structures in a specified datapath. As will be appreciated by one skilled in the art, a variety of algebraic rules may be invoked to generate algebraically equivalent structures. These rules may be stored in the form of "IF... THEN..." clauses. For instance, "IF the structured library does not have an element that can perform operation A, AND the structured library satisfies certain conditions, THEN transform operation A into an equivalent expression." The following is a table of exemplary algebraic conversion rules:

that is cascaded with another eight input multiplexer 134. Multiplexer structure 136 replaces a nine input multiplexer with a six input multiplexer 137 that is cascaded with a four input multiplexer 138.

Returning to FIG. 8, the invention preferably includes an instance mapper 140. The instance mapper 140 is employed to map RTL latches, flip-flops, and 3-state buffers with equivalent structures within the structured library 76. A match structure, as previously defined, identifies the available structures within the structured library 76.

The datapath synthesizer 74 of the present invention utilizes the structured library 76, the operation mapper 114, the algebraic transformer 120, the multiplexer decomposer 130, and the instance mapper 140 to generate a list of datapath elements and corresponding connections that can implement the operations of the test circuit. This information is stored in a synthesized datapath structure 142. The synthesized datapath structure 142 represents the derived datapath.

Figure 13:
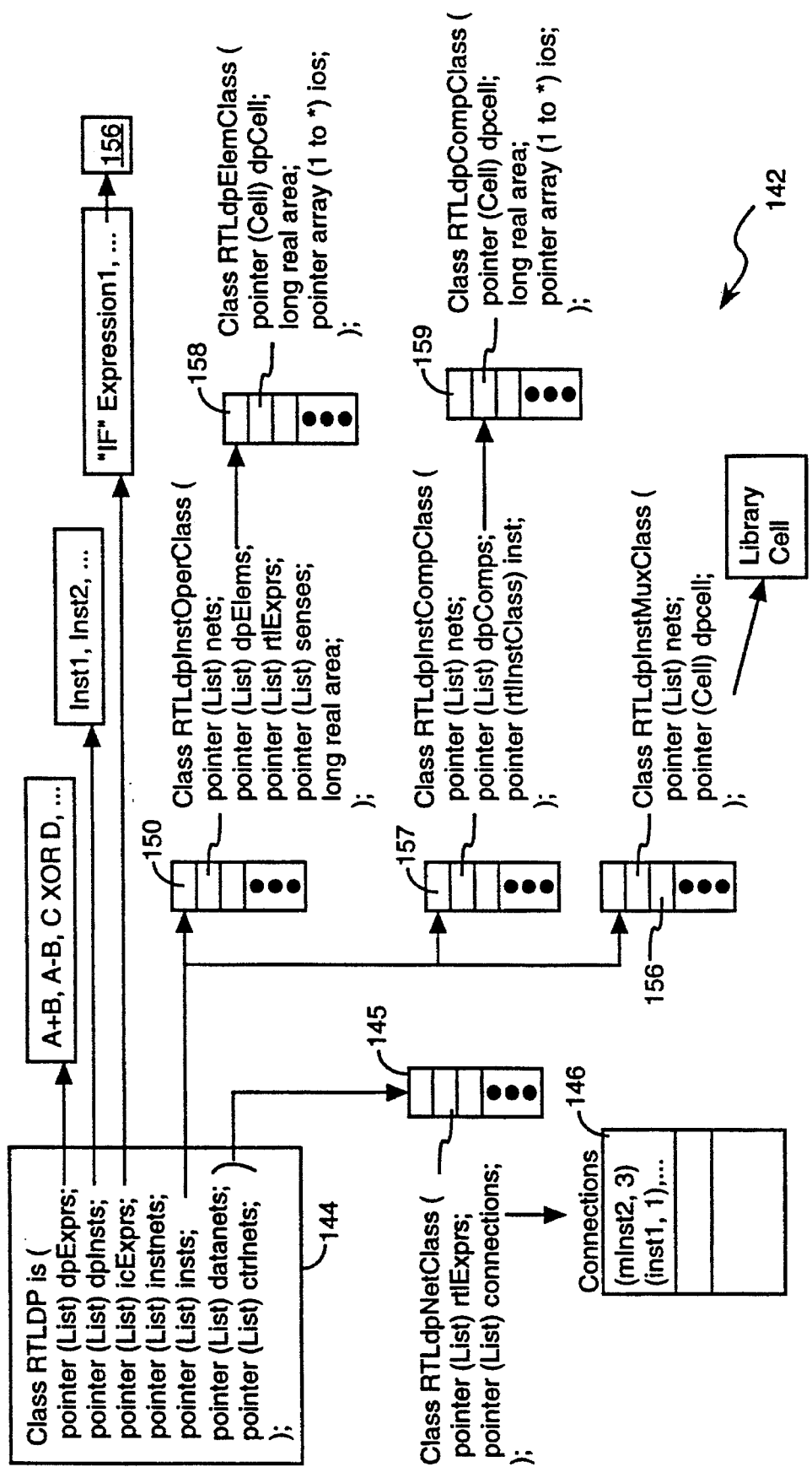
FIG. 13 depicts the relation between various data structures within the synthesized datapath structure of the invention.

Referring to FIG. 13, the header or directory 144 of the synthesized datapath structure 142, labelled RTLDP, is structured as follows:

```
class RTLDP is (
    pointer (List) dpExprs;
    pointer (List) dpInsts;
    pointer (List) icExprs;
    pointer (List) instNets;
    pointer (List) insts;
    pointer (List) dataNets;
    pointer (List) ctrlNets;
);
```

The "dpExprs" in RTLDP 144 is a list of pointers to all the datapath expressions in the synthesized circuit, which means expressions such as A+B, A−B, C XOR D and so on. A data structure for each such expression is shown in FIG. 4 at 56. The "dpInsts" in RTLDP 144 is a list of pointers to all the instances of structural components used in the synthesized circuit. The "icExprs" field is a list of inter-connect expressions implemented by the datapath. An "if" statement is an

| | SAMPLE ENTRIES FROM TRANSFORMER TABLE | |
|---|---|---|
| RULE | OPERATION | CONVERTED FORM |
| 1 | X Not Equal To Y | NOT ( REDUCE-NOR( (X XOR Y))) |
| 2 | X (unsigned)> Y | CARRY(Y−X) = 0 |
| 3 | X (signed)>= Y | CONCAT(NOT(MSB(X)), MSB-1:0(X)) >= CONCAT(NOT(MSB(Y)), MSB-1:0(Y)) |
| 4 | X >= Y | CARRY(X−Y−1) = 0 |
| 5 | X >= Y | (X>Y) OR (X=Y) |

Returning to FIG. 8, the present invention preferably includes a multiplexer decomposer 130 that maps a large multiplexer into a tree structure of smaller multiplexers if it is spatially advantageous to do so (i.e., if it reduces the total amount of circuit area used). The layout area associated with each multiplexer cell in the library is obtained from a cell area look-up utility 93 that outputs area values, and also port width values, in response to cell type identifiers. The multiplexer decomposer 130 accesses this information to generate a minimum area tree structure of multiplexers.

FIGS. 12A and 12B provide two examples of cascaded multiplexers that can be generated by the multiplexer decomposer 130. Multiplexer structure 132 replaces a fifteen port input multiplexer with an eight input multiplexer 133 inter-connect expression implemented by the datapath in the form of a multiplexer. The "insts" field is a list of entries that represent the various datapath instances that implement an expression from the field "dpExprs" or "icExprs" or an instance from the field "dpInsts". The data structures for these fields are described below.

The "instNets" field corresponds to the outputs of component instances in the "dpInsts" list. Using the example of FIG. 5, this field would list "Outp1" for the instance "Inst1" of the "Dff" component. The "dataNets" field contains a list of pointers to data structures RTLdpNetClass 145 and Connections 146 that store information representing all the interconnections between components of the synthesized datapath circuit, as will be described below.

The "ctrlNets" field stores a list of pointers to records in the net data structures 145, 146 that indicate the nodes to which the circuit's control signals are connected. Control signals determine what operation a datapath element performs. In the example of FIGS. 3 and 4, an addition or subtraction of "a" and "b" is performed depending upon the value of the "sel" signal, and thus the "sel" signal is a control signal.

The "insts" field in RTLDP 144 holds a list of pointers to datapath instance. Each datapath instances is represented by one of the following data structures: RTLdpInstOperClass 150 for datapath components that implement datapath expressions, RTLdpInstMuxClass 156 for multiplexers and RTLdpInstCompClass 157 for structural components.

To illustrate the nature of this synthesized datapath structure, the circuit elements of FIG. 3 and their corresponding DAGs in FIG. 5 will be used as an example. The field "dpExprs" defines a list of operator expressions that are implemented in the datapath. For the circuit of FIG. 3, the list of operator expressions is "A+B", "A−B", and "C XOR D". The field "dpInsts" is a list of component instances used in the datapath. In this example, only one component instance ("inst1" of a D flip-flop) is used. However, note that the instance mapper 130 may also identify multiple items for this list.

The rtldpInstOperClass data structure corresponding to a possible entry in the "insts" field is defined as follows:

```
class rtldpInstOperClass (
    pointer (List) nets;
    pointer (List) dpElems;
    pointer (List) rtlExprs;
    pointer (List) senses;
    long real area;
);
```

Each record 150 of type rtldpInstOperClass references in its "dpElems" list, all of the datapath elements in the structured library that can implement the set of expressions listed in the "rtlExprs" list. Before the optimization process, described below, the "rtlExprs" list in each record 150 contains just one expression. For instance, the expression "A+B" would be in one record 150, and that record would contain a pointer list "dpElems" that lists all the cells in the library 74 that can perform that expression. When two or more expressions are merged during the circuit optimization process, the "rtlExprs" list in the corresponding record 150 will contain a list of pointers to several expressions, and the "dpElems" list will be reduced in size so as to point only to library elements that can perform all of the expressions in the "rtlExprs" list. The "senses" field of record 150 is used to determine mutual exclusiveness, and typically contains a logical expression, such as "ctrl3=1" that indicates the conditions under which the expressions in "rtlExprs" need to be executed.

Each of the elements referenced in the "dpElems" list is a data structure 158 of type "rtldpElemClass", defined as follows:

```
class rtldpElemClass (
    pointer (Cell) dpcell;
    long real area;
    pointer array(1 to *) ios;
);
```

The field "dpcell" holds a pointer to a cell in the structured library 74. The field "area" holds the physical circuit layout area of the element, as well as any associated multiplexers added thereto during the circuit optimization process. The field "ios" holds a list of arrays. Each array holds the port mapping information about how this element implements the corresponding expression in the list "rtlExprs" of the "rtldpInstOperClass" structure 150.

The rtldpInstCompClass data structure 157 corresponding to a possible entry in the "insts" field is defined as follows:

```
class rtldpInstCompClass (
    pointer (List) nets;
    pointer (List) dpComps;
    pointer (rtlInstClass) inst;
);
```

This structure references all the datapath elements that can implement an instance from the list "dpInsts" of the RTLDP structure 144. These elements are represented by "dpComps" list, where each item in the list is of a type "RTLdpCompClass", described below. The filed "inst" is the instance in the RTL structure for which the datapath is being implemented.

Each record 159 of type RTLdpCompClass, corresponding to the "dpComps" field in 157 is defined as follows:

```
class rtldpCompClass (
    pointer (Cell) dpcell;
    long real area;
    pointer array (1 to *) ios;
);
```

The field "dpcell" holds a pointer to the corresponding library cell, "area" field holds the physical area of the element, and the field "ios" holds the port mapping about how this element implements the "inst" field of the RTLdpInstCompClass structure 157.

The records 156 in the RTLdpInstMuxClass data structure each correspond to a multiplexer entry in the "insts" field of RTLDP 144, and are defined as follows:

```
class rtldpInstMuxClass (
    pointer (List) nets;
    pointer (Cell) dpcell;
);
```

This structure refers to a multiplexer used to implement "IF" expressions in the "icExprs" field of RTLDP 144. The "dpcell" field points to a cell in the library 74 that defines the multiplexer. The "nets" list points to the RTLdpNetClass data structures 145 for defining all the connections to this multiplexer.

The RTLdpNetClass data structure records 145, corresponding to the "datanets" and "ctrlNets" fields of RTLDP 144, as well as to the "nets" fields in the RTLdpInstOperClass records 150, the RTLdpInstCompClass records 157, and the RTLdpInstMuxClass records 156, is defined as follows:

```
class rtldpNetClass (
    pointer (List) rtlExprs;
    pointer (List) connections
);
```

The entry "rtlExprs" is the list of expressions that are connected to one net (i.e., one circuit node) and "connections" is the list of pointers to connection records 146. Each connection record 146 contains a list of all the component ports that are connected to one another. Each item in the component record is of the form "component identifier, port number". Thus a component record with the items "inst1,1", "minst2,3" indicated that port 1 of "inst1" is connected to port 3 of "minst2".

Figure 14:
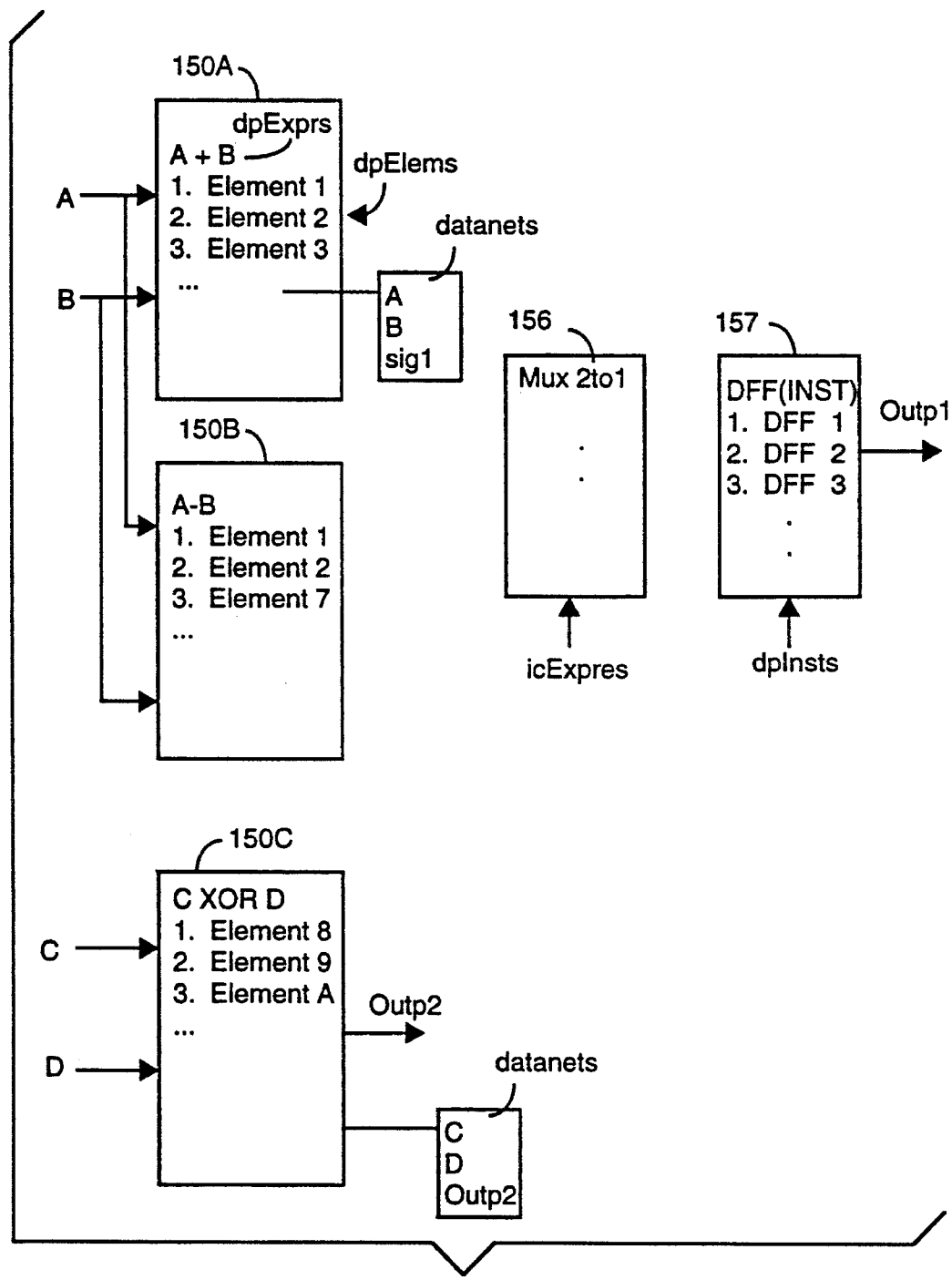
FIG. 14 illustrates some of the components that are stored in the synthesized datapath structure of the invention.

FIG. 14 is a conceptual representation of how the data structures in FIG. 13 are applied to the example associated with FIGS. 3 and 5. Block 150A contains a list of elements from the structured library 76 that perform the operation "A+B". This block is stored in the "insts" field of RTLDP. Analogously, blocks 150B and 150C respectively contain a list of elements from the structured library 76 that perform the operations "A–B" and "C XOR D". These blocks are also stored in the "insts" field of RTLDP. The operations "A+B", "A–B", and "C XOR D" are stored in the field "dpExprs". Block 156 is the multiplexer instance used to implement the "IF" expression within the datapath. This block is in the "insts" field of RTLDP. The "IF" expression is stored in the "icExpres" field. Block 157 is the instance of D-type Flip-FLop (DFF) used to implement the RTL description instance "Inst1". This block 157 is also pointed to by a pointer in the "insts" field of RTLDP.

DATAPATH OPTIMIZATION

Returning to FIG. 8, the datapath synthesizer 74 operates on the synthesized datapath structure 142 to select circuit elements from the synthesized datapath structure for physical implementation. Known techniques may be used to select elements based upon circuit area, speed, size, power consumption, or other factors. In addition to this processing, the present invention employs a datapath optimizer 78, as depicted in FIG. 1. The datapath optimizer 78 of the invention performs two critical operations.

Figure 15:
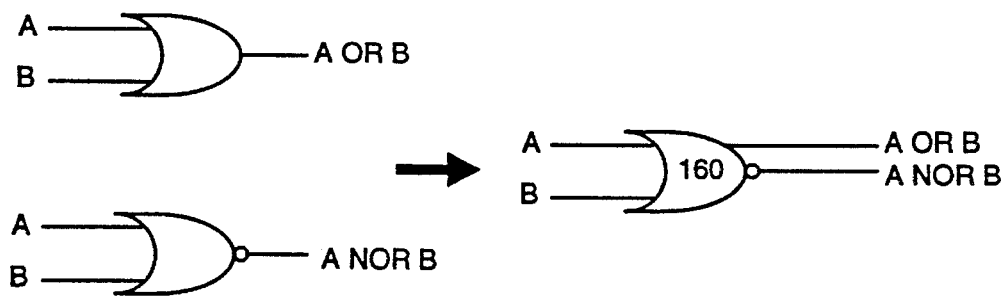
FIG. 15 illustrates the merging of two operations by using a two-output element from a structured library.

One operation associated with the datapath optimizer 78 is to merge elements with multiple outputs. By way of example, consider a library cell 160 that can implement the expression "A OR B" and the expression "A NOR B", as depicted in FIG. 15. The instances of these operations would be stored in the "dpInsts" field of the RTLDP data structure 142. The datapath optimizer 78 merges these two instances to generate a single element 160 that performs both operations. Analogous cases arise for other types of cells such as adders, subtracters, and multipliers. The datapath optimizer eliminates multiple elements when they can be combined into a single circuit element.

Figure 16:
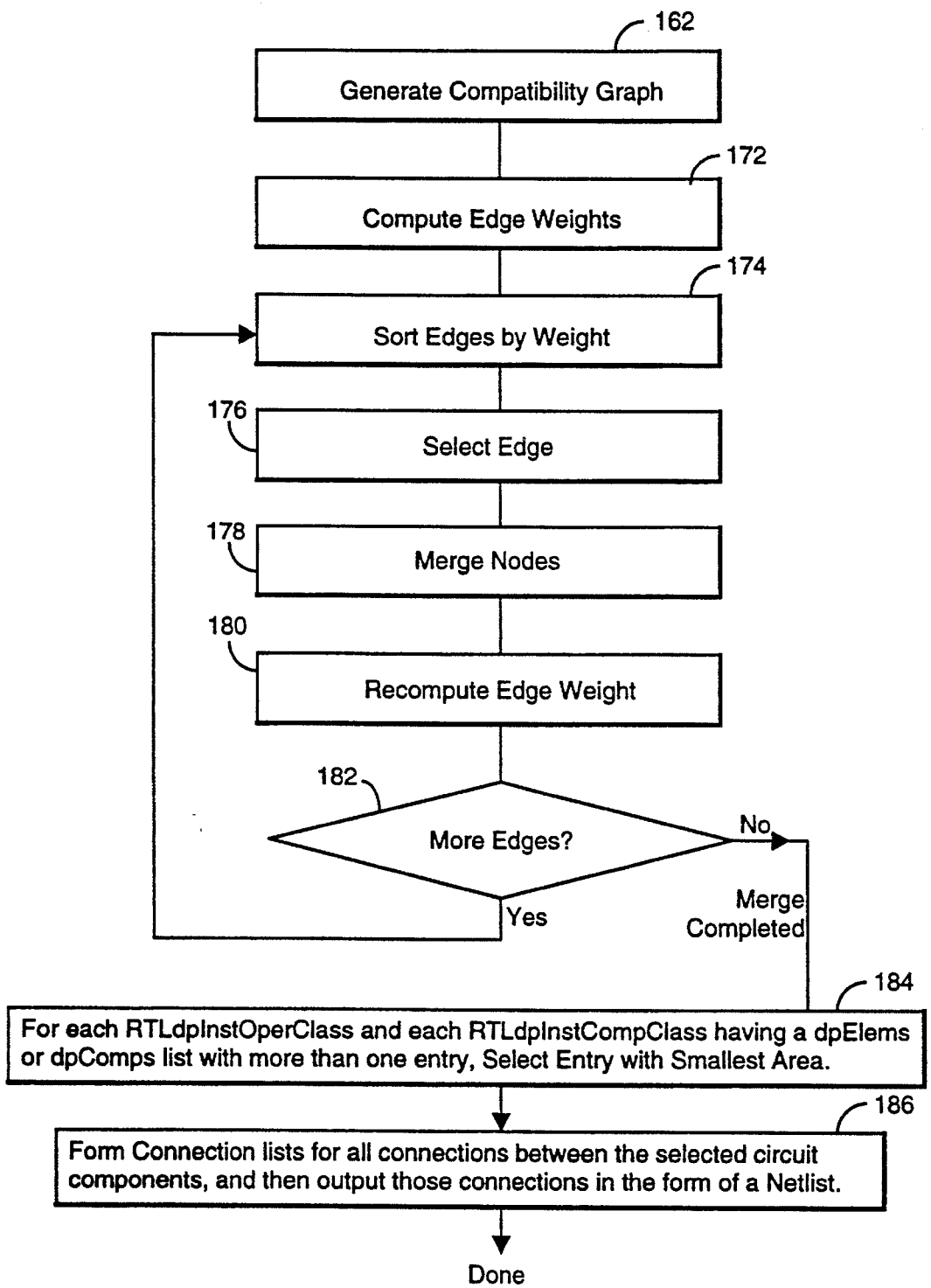
FIG. 16 is a flow chart of the merging operation employed in accordance with the invention.
Figure 17:
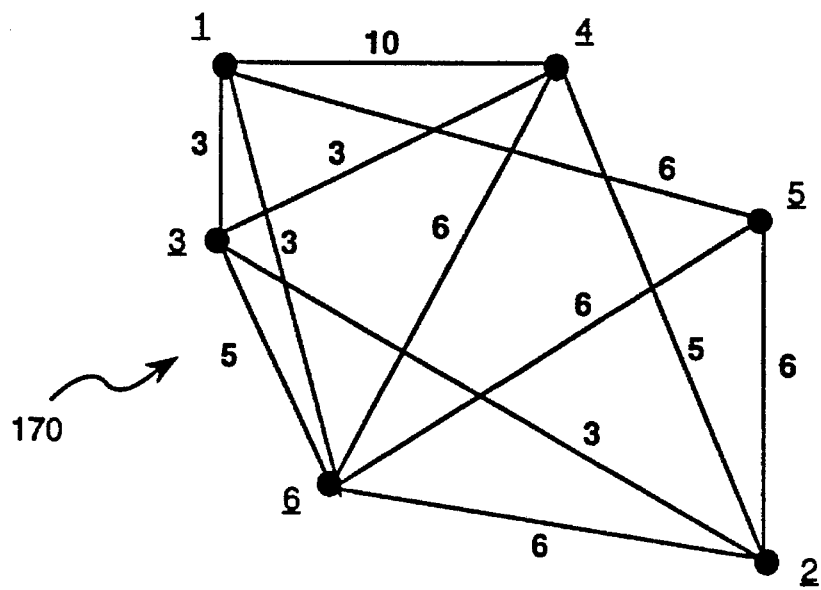
FIG. 17 is an example of a compatibility graph.

Another operation associated with the datapath optimizer 58 is the merging of mutually exclusive operations. The datapath optimizer 58 merges mutually exclusive operations to save area. The layout area associated with each cell in the library is obtained by the optimizer from a cell area look-up utility 93 that outputs area values in response to cell type identifiers (see FIG. 8). The steps associated with this operation are set forth in FIG. 16. The first step associated with the merge operation is to generate a compatibility graph (block 162). FIG. 17 depicts a compatibility graph 170. Compatibility graphs, which are known in the art, are created to represent the mutual exclusiveness of operations. The nodes of the graph represent various operations to be performed. Edges are created only between nodes representing mutually exclusive operations. Each edge is assigned a weight that is a measure of the area savings when two operations are merged.

The compatibility graph of FIG. 17 corresponds to an addition/subtraction circuit defined as follows:

```
entity addsub is
  port (sel: in bit_vector(1 downto 0);
    a,b,c,d,e,f: in bit_vector(7 downto 0);
    outp: out bit_vector(7 downto 0)
  );
architecture addsub of addsub is
begin
  process(sel,a,b,c)
  begin
    if sel = "10" then
      outp <= a+b+c;
    else if sel = "01" then
      outp <= c+d;
    else if sel = "00" then
      outp <= f–e;
    else
      outp <= a+d–c;
    end if;
  endprocess;
end addsub;
```

The datapath for this example has the following expressions: (1) A+B; (2) (A+B)+C; (3) F–E; (4) A+D; (5) (A+D)–C; (6) (C+D); (7) "IF" statement. Each underlined operation index in the foregoing list corresponds to the node numbers in FIG. 17. All of these operations are mutually exclusive except the operations (1) and (2), and the operations (4) and (5). The edges formed between the nodes indicate that the operations are mutually exclusive.

Returning to FIG. 16, the next step associated with the merge operation is to compute the edge weights (block 172). The edge weight is a measure of area savings when the two operations are merged. Edge weight calculations are known in the art. Basically, each edge represents the greatest possible savings, given all the components which perform both operations represented by two nodes, if the two components were to be combined. The edges in FIG. 17 include edge weights ranging from 1 to 10.

The next step associated with the merge operation is to sort the edges by weight (block 174). That is, the edges are sorted by area savings. In this case, the edges will be sorted from 10 down to 1. The next step associated with the invention is to select an edge from the sorted edges (block 176). The edge selected is the edge having the highest weight associated with it. The nodes associated with the edge are then merged (block 178). In this example, node 4 is merged into node 1 because there is an edge weight of 10 associated with the edge between these nodes. The merger of these elements is pictorially represented in FIG. 18. Adder 190 is merged with adder 192 by using a multiplexor 196 and an adder 194. The area saved by the merger is defined by: (Area of Adder (190) + Area of Adder (192) + Area of Mux (198)) – (Area of Adder (194) + Area of Mux (196)).

Figure 19:
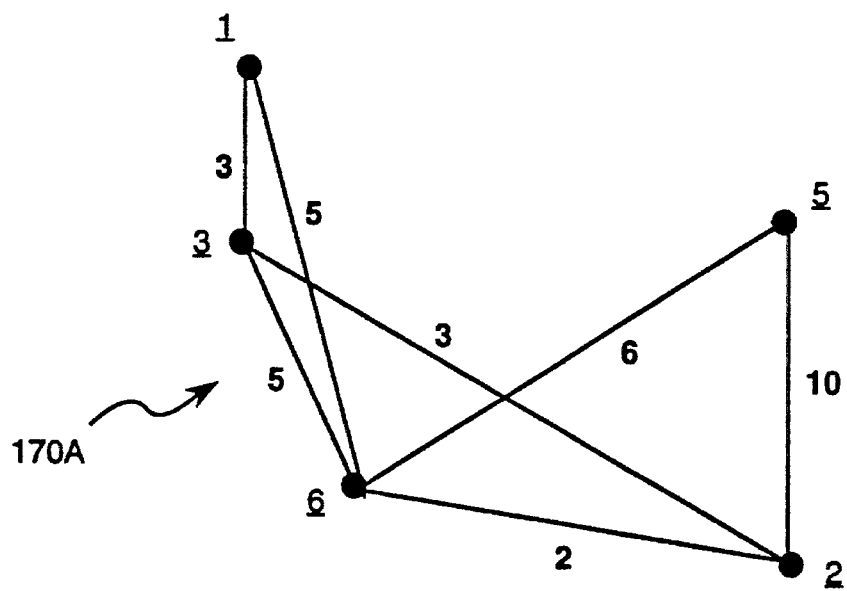
FIG. 19 depicts the compatibility graph of FIG. 17 after a merge operation.

The merge operation (block 178) now generates a new compatibility graph 170A in which nodes 1 and 4 have been replaced by a new merged node 1. This graph is depicted in FIG. 19. The merge operation observes the following rule: an edge exists between a newly merged node and a former node in the graph if an edge previously existed between those two nodes and an edge existed between the former node and the eliminated node. For example, referring to FIGS. 17 and 19, an edge would continue to exist between nodes 1 and 3 because merged node 1 was previously connected to 3 and an edge existed between the former node 3 and the eliminated node 4. Conversely, an edge would be eliminated between nodes 1 and 5 because an edge never existed between the former node 5 and the eliminated node 4.

Figure 20:
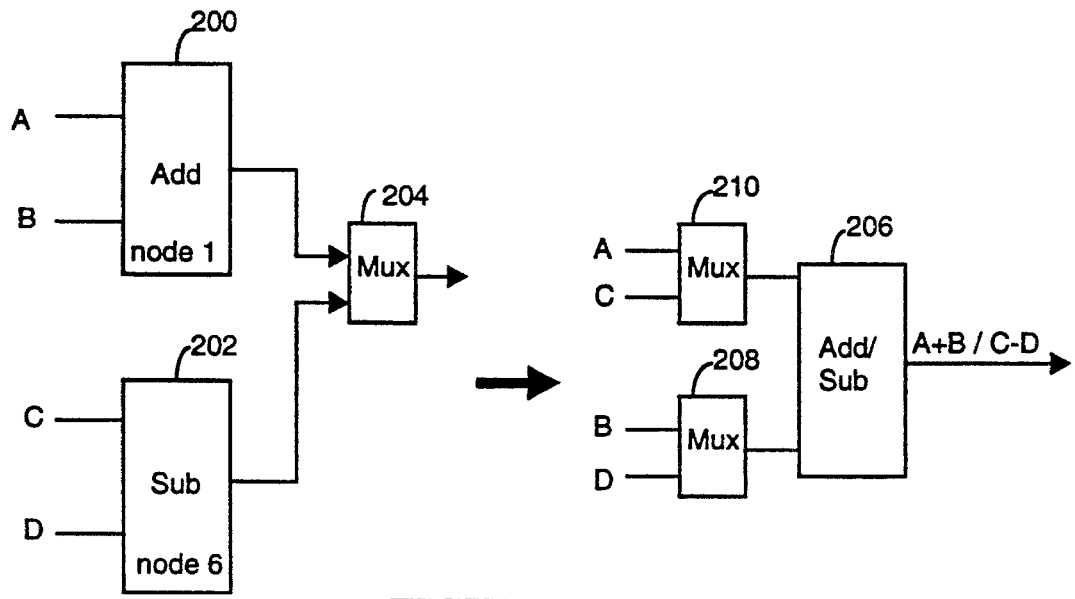
FIG. 20 illustrates the computation of an edge value within a compatibility graph.
Figure 21:
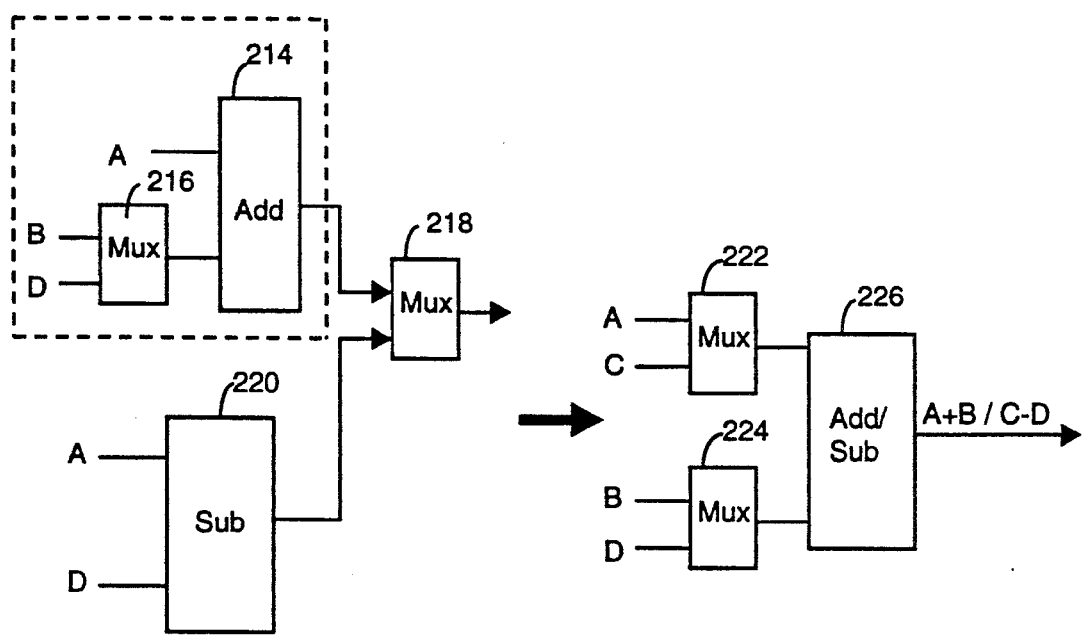
FIG. 21 illustrates the recomputation of an edge value between merged nodes within a compatibility graph.

The next step is to recompute the edge weights (block 180). The prior art approach to recomputing edge weights is to merely recompute the edges which are coupled to a merged node. This operation is illustrated in relation to FIGS. 20 and 21. FIG. 20 depicts the elements associated with the edge between nodes 1 and 6 in FIG. 17. The edge weight is initially defined as follows: (Area of Adder (200) + Area of Subtractor (202) + Area of Mux (204)) − (Area of Adder/Subtractor (206) + Area of Mux (208) + Area of Mux (210)). The edge weight after the merge operation, as illustrated in FIG. 21, is as follows: (Area of Adder (214) + Area of Mux (216) + Area of Mux (218) + Area of Subtractor (220)) − (Area of Add/Sub (226) + Area of Mux (222) + Area of Mux (224)). This calculation would be performed in accordance with prior art techniques. However, the prior art does not recognize the effect of the merge operation on other edge weights. The present invention recognizes and accounts for the changing weights on non-merged edges. This is illustrated in FIGS. 22 and 23.

Figure 18:
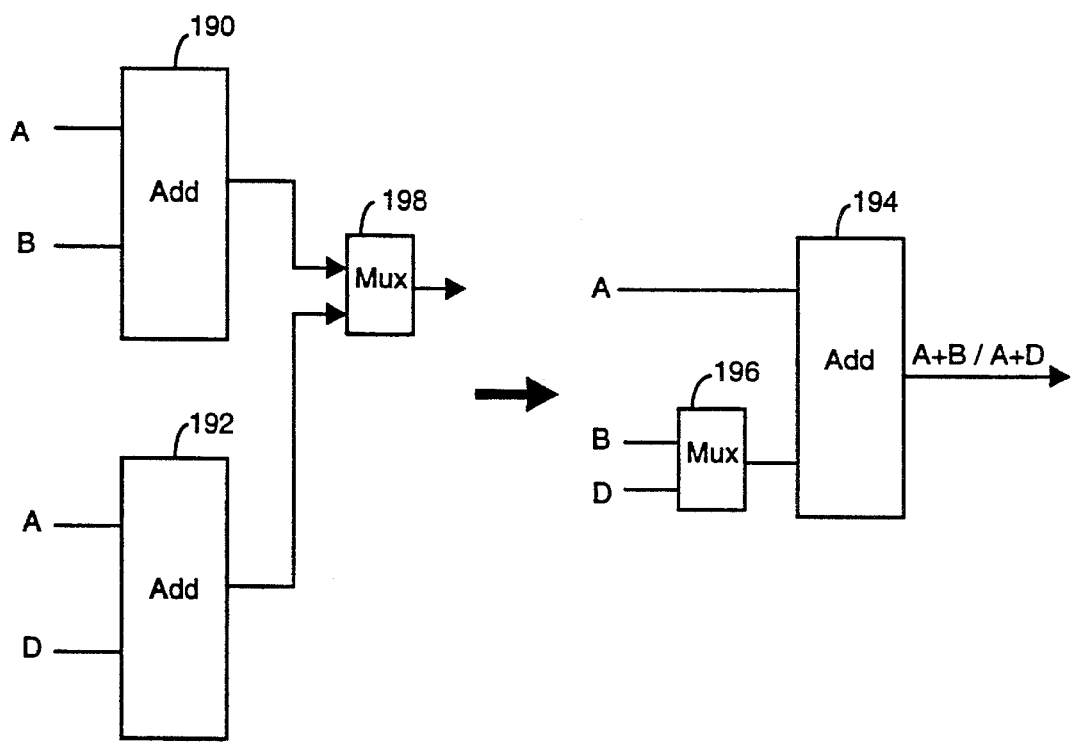
FIG. 18 illustrates the merging of two operations.
Figure 22:
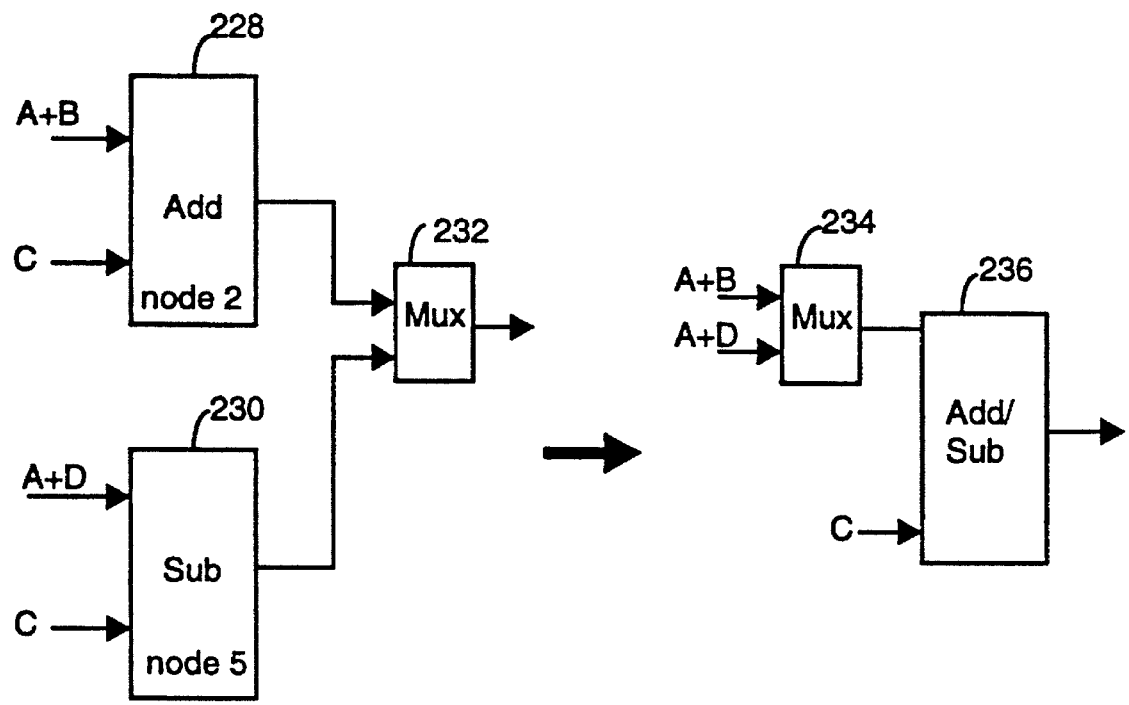
FIG. 22 illustrates the computation of an edge value within a compatibility graph.
Figure 23:
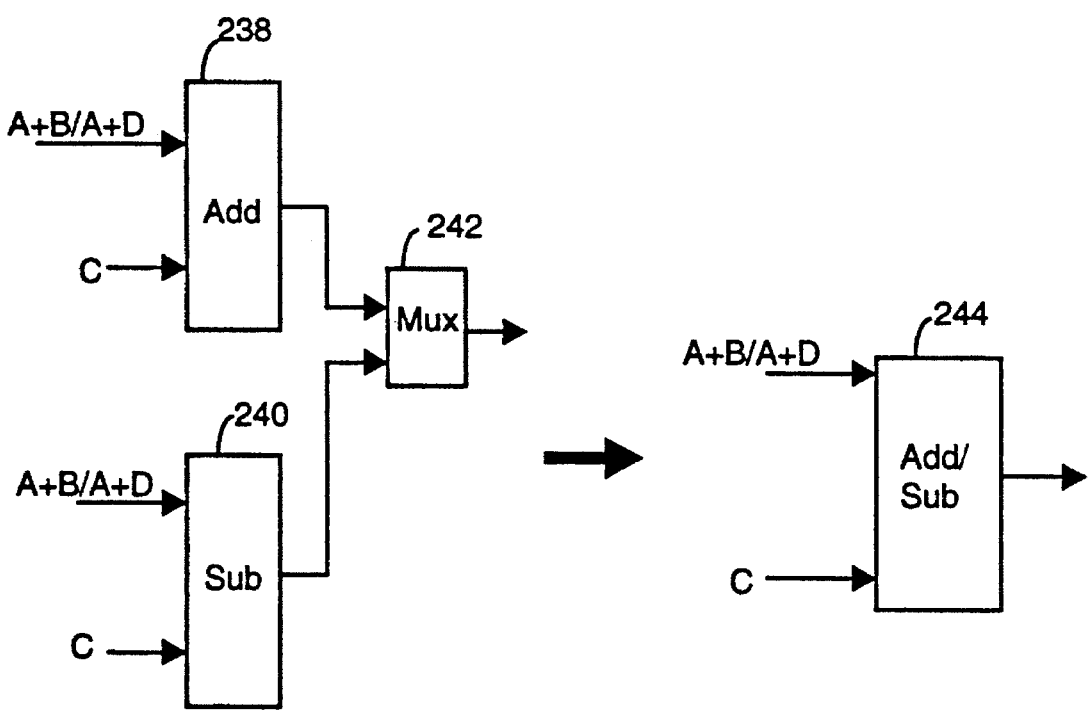
FIG. 23 illustrates the computation of an edge value between non-merged nodes within a compatibility graph.

FIG. 22 depicts the elements corresponding to nodes 2 and 5 of FIG. 17. The edge weight for these elements prior to the merge operation is: (Area of Adder (228) + Area of Mux (232) + Area of Subtractor (230)) − (Area of Add/Sub (236) + Area of Mux (234)). FIG. 23 demonstrates how the weight of edge 2–5 is computed after the merge operation. Since the nodes 1 and 4 were merged, the expressions A+B and A+D are available on the same wire as shown in FIG. 18. The present invention accounts for the increased weight of the edge attributable to the availability of A+B and A+D on the same wire. In other words, the weight of the edge is increased by the area of a multiplexer. The new weight is: (Area of Adder (238) + Area of Mux (242) + Area of Subtractor (240)) − (Area of Add/Sub (244)).

Thus, non-merged edges are effected by a merge operation. The present invention recognizes this phenomenon and recomputes the edge weights of non-merged edges. This operation is distinct from the prior art approach of merely recomputing the edge weights of merged edges.

Returning to FIG. 16, decision block 182 tests if any more edges are left in the graph. If there are any edges remaining, control returns back to block 174. Otherwise, the merge/optimization process is completed, and then the datapath synthesis process is completed by (A) for each RTLdpInstOperClass record 150 and each RTLdpInstCompClass record 157 (see FIG. 13) having a dpElems or dpComps list with more than one entry, selecting the entry with the smallest circuit layout area (step 184), and (B) forming the connection lists 146 for the selected circuit components that implement the specified datapath, and outputting those connections in the form of a circuit Netlist (step 186). As mentioned above, in alternate embodiments, when multiple components are available to implement a set of datapath expressions, the components could be selected on the basis of criteria other than circuit layout area. Examples of alternate selection criteria include minimization of power consumption and speed of operation, in which case the corresponding power consumption information or speed information would need to be provided to the datapath synthesizer by the Cell Lookup Utility 93 or any equivalent mechanism.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A method executed by a computer under the control of a program, said computer including a memory for storing said program, said method comprising the steps of:

receiving in said computer a hardware description language description of an electronic circuit, said hardware description language description of said electronic circuit including circuit element descriptions and circuit connection descriptions, said circuit element descriptions defining datapath functions performed by said electronic circuit;

storing in said memory a library with a plurality of hardware description language datapath library elements that perform specified datapath operations;

parsing
said circuit element descriptions of said hardware description language description of said electronic circuit into circuit element intermediate register transfer level (RTL) descriptions, each of said circuit element intermediate RTL descriptions including a first list of pointers to data structures with multiple input and output ports and a second list of pointers to data structures representing logical or mathematical expressions, and said hardware description language datapath library elements into datapath library element intermediate RTL descriptions, each of said datapath library element intermediate RTL descriptions including a first list of pointers to data structures representing input and output ports and a second list of pointers to data structures representing logical or mathematical expressions;

transforming
each of said circuit element intermediate RTL descriptions into a corresponding circuit element directed acyclic graph, thereby generating a set of circuit element directed acyclic graphs, each of said dampath library element intermediate RTL descriptions into a corresponding datapath library element directed acyclic graph, thereby generating a set of datapath library element directed acyclic graphs;

synthesizing a datapath structure representing said electronic circuit, said synthesizing step including the step of matching said circuit element directed acyclic graphs with said datapath library element directed acyclic graphs to identify matched datapath library elements which perform said datapath functions defined by said circuit element descriptions; and generating a netlist of circuit elements selected from said matched datapath library elements.

2. The method of claim 1 wherein said matching step includes the steps of identifying a circuit element directed acyclic graph that cannot be matched with said datapath library element directed acyclic graphs and thereby forms an unmatched directed acyclic graph;

transforming said unmatched directed acyclic graph into an algebraically equivalent substitute directed acyclic graph; and matching said algebraically equivalent substitute directed acyclic graph with a corresponding dampath library element directed acyclic graph.

3. The method of claim 1 wherein said synthesizing step includes the steps of:

receiving a spacial area value associated with each of several predefined multiplexers having different numbers of ports;

representing multiplexers utilized in said synthesized datapath structure; and transforming a multiple port multiplexer into an equivalent tree structure of multiplexers in said synthesized datapath structure, said tree structure of multiplexers having an associated circuit layout area which is smaller than said multiple port multiplexer's associated circuit layout area.

4. The method of claim 1 further including the step of merging selected ones of said circuit element descriptions defining said datapath functions into combined functions in accordance with predefined optimization criteria, wherein each combined function is performed by at least one of said plurality of hardware description language datapath library elements.

5. The method of claim 4 wherein said merging step includes the step of merging single output datapath functions defined by said circuit element descriptions into multiple output datapath functions.

6. A computer readable memory that can be used to direct a computer to function in a specified manner, comprising:

circuit data stored in said memory, said circuit data including:

a hardware description language description of an electronic circuit, said hardware description language description of said electronic circuit including circuit element descriptions and circuit connection descriptions, and a library of hardware description language dampath circuit elements that perform specified datapath operations; and executable instructions stored in said memory, said executable instructions including:

instructions to parse said circuit element descriptions of said hardware description language of said electronic circuit into circuit element intermediate register transfer level (RTL) descriptions, each of said circuit element intermediate RTL descriptions including a first list of pointers to data structures with multiple input and output ports and a second list of pointers to data structures representing logical or mathematical expressions, instructions to parse said hardware description language datapath circuit elements into datapath library element intermediate RTL descriptions, each of said datapath library element intermediate RTL descriptions including a first list of pointers to data structures representing input and output ports and a second list of pointers to data structures representing logical or mathematical expressions, instructions to transform each of said circuit element intermediate RTL descriptions into a corresponding circuit element directed acyclic graph, thereby generating a set of circuit element directed acyclic graphs, instructions to transform each of said datapath library element intermediate RTL descriptions into a corresponding datapath library element directed acyclic graph, thereby generating a set of datapath library element directed acyclic graphs, instructions to match said circuit element directed acyclic graphs with said datapath library element directed acyclic graphs to produce matched datapath library elements, and instructions to synthesize a datapath circuit netlist having datapath library elements corresponding to said matched datapath library elements.

\* \* \* \* \*